US007114132B2

United States Patent
Yaguchi

(10) Patent No.: US 7,114,132 B2
(45) Date of Patent: Sep. 26, 2006

(54) DEVICE, SYSTEM, SERVER, CLIENT, AND METHOD FOR SUPPORTING COMPONENT LAYOUT DESIGN ON CIRCUIT BOARD, AND PROGRAM FOR IMPLEMENTING THE DEVICE

(75) Inventor: Takahiro Yaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 470 days.

(21) Appl. No.: 10/125,350

(22) Filed: Apr. 19, 2002

(65) Prior Publication Data

US 2002/0157067 A1 Oct. 24, 2002

(30) Foreign Application Priority Data

Apr. 20, 2001 (JP) ............................. 2001/122683

(51) Int. Cl.
G06F 17/50 (2006.01)
(52) U.S. Cl. .................. 716/1; 716/4; 716/11; 716/15; 716/18
(58) Field of Classification Search .................... 716/1, 716/4–5, 8–15, 18; 703/13–14, 18, 16
See application file for complete search history.

(56) References Cited

U.S. PATENT DOCUMENTS

| 6,028,989 A | * | 2/2000 | Dansky et al. .................. 716/8 |
| 2002/0022951 A1 | * | 2/2002 | Heijningen et al. ........... 703/16 |
| 2002/0040466 A1 | * | 4/2002 | Khazei .......................... 716/9 |

FOREIGN PATENT DOCUMENTS

| JP | H04-36872 A | 2/1992 |
| JP | H06-290234 A | 10/1994 |
| JP | H07-225785 A | 8/1995 |
| JP | H09-245076 A | 9/1997 |
| JP | H11-251717 A | 9/1999 |
| JP | 2000-35976 A | 2/2000 |
| JP | 2000-305976 A | 11/2000 |
| JP | 2001-92868 A | 4/2001 |
| JP | 2002-64279 A | 2/2002 |
| JP | 2002-230067 A | 8/2002 |

\* cited by examiner

Primary Examiner—Paul Dinh
(74) Attorney, Agent, or Firm—Sughrue Mion, PLLC

(57) ABSTRACT

There is provided a circuit design supporting device, a circuit board design supporting system, a circuit board design supporting server, a circuit board design supporting client, a circuit design supporting method, and a program for realizing the device for designing a layout of main components such as LSI, etc. on a circuit board such as a printed circuit board wherein unnecessary electromagnetic radiation is suppressed. The circuit design supporting device comprises a noise generating level adding means and a component locating means. The noise generating level adding means adds noise generating level information to a component to be located on a printed circuit board. The component locating means includes a component position detecting section, a voltage distribution detecting section, a noise generating level comparing section, and an error informing section. The component position detecting section detects a position of the component moved on the printed circuit board. The voltage distribution detecting section detects a voltage level on the printed circuit board in the detected position of the component. The noise generating level comparing section compares the detected voltage level with the noise generating level added to the component. The error informing section informs a user of an error when the voltage level on the printed circuit board is equal to or larger than the noise generating level as a result of the comparison.

45 Claims, 25 Drawing Sheets

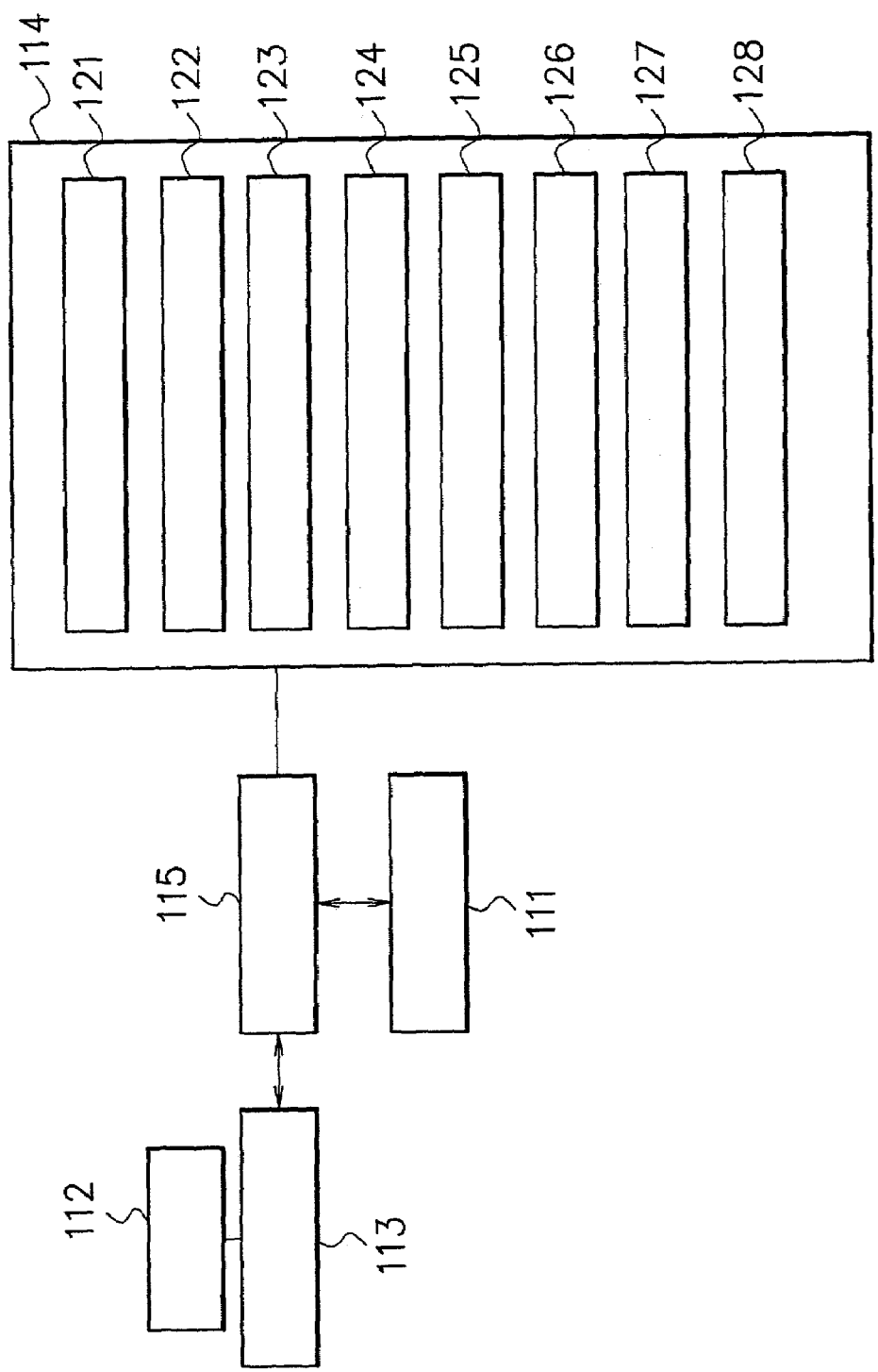

FIG. 4

COMPONENT LIBRARY 3

| COMPONENT ID | CATEGORY | NAME | TYPE | STANDARD | SHAPE (SIZE) | NOISE GENERATING LEVEL INFORMATION |
|---|---|---|---|---|---|---|
| A1 | COMPONENT CATEGORY A | COMPONENT A1 | A1 TYPE | A1 STANDARD | SHAPE A1 | NOISE GENERATING LEVEL L5 |
| A2 | COMPONENT CATEGORY A | COMPONENT A2 | A2 TYPE | A2 STANDARD | SHAPE A2 | NOISE GENERATING LEVEL L7 |
| A3 | COMPONENT CATEGORY A | COMPONENT A3 | A3 TYPE | A3 STANDARD | SHAPE A3 | NOISE GENERATING LEVEL L6 |
| ... | ... | ... | ... | ... | ... | ... |
| B1 | COMPONENT CATEGORY B | COMPONENT B1 | B1 TYPE | B1 STANDARD | SHAPE B1 | NOISE GENERATING LEVEL L3 |
| B2 | COMPONENT CATEGORY B | COMPONENT B2 | B2 TYPE | B2 STANDARD | SHAPE B2 | NOISE GENERATING LEVEL L4 |
| B3 | COMPONENT CATEGORY B | COMPONENT B3 | B3 TYPE | B3 STANDARD | SHAPE B3 | NOISE GENERATING LEVEL L3 |
| ... | ... | ... | ... | ... | ... | ... |
| C1 | COMPONENT CATEGORY C | COMPONENT C1 | C1 TYPE | C1 STANDARD | SHAPE C1 | NOISE GENERATING LEVEL L5 |
| C2 | COMPONENT CATEGORY C | COMPONENT C2 | C2 TYPE | C2 STANDARD | SHAPE C2 | NOISE GENERATING LEVEL L6 |
| C3 | COMPONENT CATEGORY C | COMPONENT C3 | C3 TYPE | C3 STANDARD | SHAPE C3 | NOISE GENERATING LEVEL L8 |
| ... | ... | ... | ... | ... | ... | ... |
| ... | ... | ... | ... | ... | ... | ... |

FIG. 8

CATEGORY-BY-CATEGORY LEVEL DATABASE 31

| CATEGORY | NOISE GENERATING LEVEL INFORMATION |
|---|---|
| COMPONENT CATEGORY A | NOISE GENERATING LEVEL L5 |
| COMPONENT CATEGORY B | NOISE GENERATING LEVEL L7 |
| COMPONENT CATEGORY C | NOISE GENERATING LEVEL L3 |
| ⋮ | ⋮ |

FIG. 10

CANDIDATE COMPONENT LIST

| CATEGORY | NAME | TYPE | STANDARD | SHAPE (SIZE) | NOISE GENERATING LEVEL INFORMATION |
|---|---|---|---|---|---|
| COMPONENT CATEGORY A | COMPONENT A1 | A1 TYPE | A1 STANDARD | SHAPE A1 | NOISE GENERATING LEVEL L5 |
| | COMPONENT A2 | A2 TYPE | A2 STANDARD | SHAPE A2 | NOISE GENERATING LEVEL L7 |
| | COMPONENT A3 | A3 TYPE | A3 STANDARD | SHAPE A3 | NOISE GENERATING LEVEL L6 |
| | ... | ... | ... | ... | ... |
| COMPONENT CATEGORY B | COMPONENT B1 | B1 TYPE | B1 STANDARD | SHAPE B1 | NOISE GENERATING LEVEL L3 |
| | COMPONENT B2 | B2 TYPE | B2 STANDARD | SHAPE B2 | NOISE GENERATING LEVEL L4 |
| | COMPONENT B3 | B3 TYPE | B3 STANDARD | SHAPE B3 | NOISE GENERATING LEVEL L3 |
| | ... | ... | ... | ... | ... |
| COMPONENT CATEGORY C | COMPONENT C1 | C1 TYPE | C1 STANDARD | SHAPE C1 | NOISE GENERATING LEVEL L5 |
| | COMPONENT C2 | C2 TYPE | C2 STANDARD | SHAPE C2 | NOISE GENERATING LEVEL L6 |
| | COMPONENT C3 | C3 TYPE | C3 STANDARD | SHAPE C3 | NOISE GENERATING LEVEL L8 |
| | ... | ... | ... | ... | ... |
| ... | | | | | |

FIG. 11

LOCATED COMPONENT DATABASE 32

| COMPONENT LAYOUT ID | PRINTED CIRCUIT BOARD ID | COMPONENT ID | POSITIONAL INFORMATION | WIRING INFORMATION |
|---|---|---|---|---|
| COMPONENT LAYOUT ID1 | PRINTED CIRCUIT BOARD ID1 | A1 | X1-1;Y1-1 | WIRING A |
| | | A13 | X1-2;Y1-2 | |
| | | C112 | X1-3;Y1-3 | |
| | | ... | ... | |
| COMPONENT LAYOUT ID2 | PRINTED CIRCUIT BOARD ID2 | B11 | X2-1;Y2-1 | WIRING B |
| | | B2 | X2-2;Y2-2 | |
| | | C11 | X2-3;Y2-3 | |
| | | ... | ... | |
| COMPONENT LAYOUT ID3 | PRINTED CIRCUIT BOARD ID3 | A12 | X3-1;Y3-1 | WIRING C |
| | | B13 | X3-2;Y3-2 | |
| | | C3 | X3-3;Y3-3 | |
| ... | | | ... | ... |

FIG. 12

PRINTED CIRCUIT BOARD DATABASE 33

| PRINTED CIRCUIT BOARD ID | SHAPE (SIZE) |
|---|---|
| PRINTED CIRCUIT BOARD ID1 | SHAPE $\alpha$ |
| PRINTED CIRCUIT BOARD ID2 | SHAPE $\beta$ |
| PRINTED CIRCUIT BOARD ID3 | SHAPE $\gamma$ |
| ⋮ | ⋮ |

F I G. 16

COMPONENT LIBRARY 30

| COMPONENT ID | CATEGORY | NAME | TYPE | STANDARD | SHAPE (SIZE) | PIN ID | PIN POSITION | NOISE GENERATING LEVEL INFORMATION |
|---|---|---|---|---|---|---|---|---|
| A1 | COMPONENT CATEGORY A | COMPONENT A1 | A1 TYPE | A1 STANDARD | SHAPE A1 | PIN A1-1 | X1-1;Y1-1 | NOISE GENERATING LEVEL L7 |
|  |  |  |  |  |  | PIN A1-2 | X1-2;Y1-2 | NOISE GENERATING LEVEL L4 |
|  |  |  |  |  |  | PIN A1-3 | X1-3;Y1-3 | NOISE GENERATING LEVEL L7 |
|  |  |  |  |  |  | ... | ... | ... |
| A2 | COMPONENT CATEGORY A | COMPONENT A2 | A2 TYPE | A2 STANDARD | SHAPE A2 | PIN A2-1 | X2-1;Y2-1 | NOISE GENERATING LEVEL L8 |
|  |  |  |  |  |  | PIN A2-2 | X2-2;Y2-2 | NOISE GENERATING LEVEL L4 |
|  |  |  |  |  |  | PIN A2-3 | X2-3;Y2-3 | NOISE GENERATING LEVEL L3 |
|  |  |  |  |  |  | ... | ... | ... |
| A3 | COMPONENT CATEGORY A | COMPONENT A3 | A3 TYPE | A3 STANDARD | SHAPE A3 | PIN A3-1 | X3-1;Y3-1 | NOISE GENERATING LEVEL L5 |
|  |  |  |  |  |  | PIN A3-2 | X3-2;Y3-2 | NOISE GENERATING LEVEL L6 |
|  |  |  |  |  |  | PIN A3-3 | X3-3;Y3-3 | NOISE GENERATING LEVEL L8 |
| ... | ... | ... | ... | ... | ... | ... | ... | ... |

F I G. 18

PIN-BY-PIN LEVEL DATABASE 301

| CATEGORY | ROLE ID | NOISE GENERATING LEVEL INFORMATION |
|---|---|---|
| COMPONENT CATEGORY A | PIN a-1 | NOISE GENERATING LEVEL L7 |
| | PIN a-2 | NOISE GENERATING LEVEL L4 |
| | PIN a-3 | NOISE GENERATING LEVEL L7 |
| | ... | ... |
| COMPONENT CATEGORY B | PIN b-1 | NOISE GENERATING LEVEL L8 |
| | PIN b-2 | NOISE GENERATING LEVEL L4 |
| | PIN b-3 | NOISE GENERATING LEVEL L3 |
| | ... | ... |
| COMPONENT CATEGORY C | PIN c-1 | NOISE GENERATING LEVEL L5 |
| | PIN c-2 | NOISE GENERATING LEVEL L6 |
| | PIN c-3 | NOISE GENERATING LEVEL L8 |
| | ... | ... |
| ... | | |

NOISE GENERATING LEVEL INFORMATION ADDING MEANS 34

DEVICE, SYSTEM, SERVER, CLIENT, AND METHOD FOR SUPPORTING COMPONENT LAYOUT DESIGN ON CIRCUIT BOARD, AND PROGRAM FOR IMPLEMENTING THE DEVICE

BACKGROUND OF THE INVENTION

The present invention relates to a device, a system, a server, a client, and a method for supporting the layout design of components on a circuit board, and a program for implementing the device, and in particular, to a device, a system, a server, a client, and a method for supporting the layout design of components on a circuit board such as a multilayer printed circuit board so as to suppress unnecessary electromagnetic radiation (interference), and a program for implementing the device.

DESCRIPTION OF THE RELATED ART

There is disclosed a design supporting system for a printed circuit board to suppress unnecessary electromagnetic radiation, for example, in Japanese Patent Application Laid-Open No. 2000-35976.

As shown in FIG. 1, the system in the above application comprises a data storing device 111, a displaying section 112, an input-output device 113, a wiring layout processing section 114, and an arithmetic processor 115. The data storing device 111 stores data of components to be mounted on a printed board and data of pins set to the components, logical connection data between the pins, and wiring pattern data generated during wiring layout processing. The input-output device 113 executes input-output processing for displaying data stored in the data storing device 111 and an error indicating that it is impossible to mount (add) a bypass capacitor on the displaying section 112. The wiring layout processing section 114 mounts an additional bypass capacitor on a printed board. The arithmetic processor 115 including a program(s) controls the whole system and performs a primary arithmetic operation necessary for wiring layouts and wiring layout changes.

The wiring layout processing section 114 used in this system includes a component power source pin checking section 121, a wiring pattern checking section 122, a wiring length and width checking section 123, a bypass capacitor mounting possibility checking section 124, a wiring line relocation possibility checking section 125, a wiring line relocating section 126, a bypass capacitor mounting section 127, and an error displaying section 128. The component power source pin checking section 121 checks the position of the power source pin of a component. The wiring pattern checking section 122 checks a wiring pattern from a power source pin to a power source via hole. The wiring length and width checking section 123 checks a wiring length and width of the checked wiring pattern. The bypass capacitor mounting possibility checking section 124 checks whether or not it is possible to mount a bypass capacitor. The wiring line relocation possibility checking section 125 checks, when it is impossible to mount a bypass capacitor on the present wiring line, whether or not there is another wiring pattern line on which the bypass capacitor can be mounted. The wiring line relocating section 126 changes the present wiring line to the wiring line detected at the wiring line relocation possibility checking section 125. The bypass capacitor mounting section 127 mounts a bypass capacitor on the changed wiring line. The error displaying section 128 displays an error when it is impossible to mount a bypass capacitor even when the wiring line has been relocated.

In the prior art having such configuration, first, wiring pattern information is specified on the basis of circuit diagram information and component information inputted from the input-output device 113. Subsequently, it is determined whether or not a bypass capacitor for reducing radiation noise can be mounted on the wiring connecting a component to a power source via hole using the wiring pattern information. If the mounting is possible, the bypass capacitor is mounted. Otherwise, the wiring is relocated so as to mount the bypass capacitor.

By these operations, it is possible to support mounting a bypass capacitor in an optimum position between a power source plane and a ground plane, and there is realized a layout design wherein unnecessary electromagnetic radiation (interference) is suppressed.

However, the above-described system has the following problem that it is impossible to completely eliminate noise that becomes resonance energy between a power source plane and a ground plane, the resonance energy also being a part of the reason for unnecessary electromagnetic radiation.

This is because, although the conventional system determines the position where a bypass capacitor will be located, the system does not consider and support a layout of an element, which may become a noise source, such as a large-scale integration (LSI). Therefore, while it is possible to reduce the noise arising from the LSI by mounting a decoupling capacitor for the LSI, the resonance between the power source plane and the ground plane may be easily generated even with low energy.

SUMMARY OF THE INVENTION

It is therefore an object of the present invention to provide a device and a method capable of supporting the layout design of main components such as LSI on a printed circuit board in which unnecessary electromagnetic radiation (interference) is suppressed.

According to a first aspect of the present invention, for achieving the objects mentioned above, there is provided a circuit design support device for designing the layout of electronic components on a circuit board based on voltage and/or heat distribution information on the circuit board in a manner preventing the components from becoming a noise source and/or exceeding predetermined temperature, comprising:

a noise generation level information adding means for adding noise generation level information to a library of the component; and a first component locating means which includes a component position detecting section for detecting a position of the component on the circuit board, a component position voltage distribution detecting section for detecting a voltage level at the position where the component is located, a noise generation level comparing section for comparing the voltage level detected by the component position voltage distribution detecting section with the noise generation level in the library, and an error informing section; and/or the device comprising:

a heat generation level information adding means for adding heat generation level information to the library of the component; and a second component locating means which includes a component position detecting section for detecting a position of the component on the circuit board, a component position heat distribution detecting section for detecting a heat level at the position where the component is located, and a component locating section for locating the component on the circuit board based on the heat level.

According to a second aspect of the present invention, there is provided a circuit design support device for designing the layout of electronic components on a circuit board based on voltage and/or heat distribution information on the circuit board in a manner preventing the components from becoming a noise source and/or from exceeding predetermined temperature, comprising:

a noise generation level information adding means for adding noise generation level information to a library of the component; and a third component locating means which includes a component position detecting section for detecting a position of the component on the circuit board, a pin position detecting section for detecting a position of a pin of the component on the circuit board, a pin position voltage distribution detecting section for detecting a voltage level at the position where the pin is located, a noise generation level comparing section for comparing the voltage level detected by the pin position voltage distribution detecting section with the noise generation level of the pin in the library, and an error informing section; and/or the device comprising:

a heat generation level information adding means for adding heat generation level information to the library of the component; and a second component locating means which includes a component position detecting section for detecting a position of the component on the circuit board, a component position heat distribution detecting section for detecting a heat level at the position where the component is located, and a component locating section for locating the component on the circuit board based on the heat level.

The library may include at least component IDs for identifying the components and either or both of the noise generation level information and heat generation level information of the components.

Moreover, the library may be fed with the voltage level information and/or heat level information on the circuit board from the component position voltage distribution detecting section and/or the component position heat distribution detecting section and updated, the information being used for supporting the layout design of the components.

Further, the circuit board design support device may further comprise a displaying section for displaying at least one component and the voltage distribution or heat distribution on a display screen for reference in order to locate at least a component on the circuit board.

In addition, the circuit board design support device may further comprise an interface for connecting the device to external devices or networks.

Moreover, the circuit board design support device may be constructed as a stand-alone device.

Furthermore, the circuit board design support device may further comprise a database having the library.

According to a third aspect of the present invention, there is provided a circuit design support system for designing the layout of electronic components on a circuit board, comprising the device in the first or second aspect and a database having the library.

The library in the system may include at least component IDs for identifying the components and either or both of the noise generation level information and the heat generation level information.

Further, the library in the system may be fed with the voltage level information and/or heat level information on the circuit board from the component position voltage distribution detecting section and/or the component position heat distribution detecting section and updated, the information being used for supporting the layout design of the components.

Moreover, the system may be constructed as a stand-alone system.

According to a fourth aspect of the present invention, there is provided a server for supporting the layout design of electronic components on a circuit board, which is the device in the first or second aspect.

According to a fifth aspect of the present invention, there is provided a client for supporting the layout design of electronic components on a circuit board, which is the device in the first or second aspect, and connected to the server in the fourth aspect via a network.

According to a sixth aspect of the present invention, there is provided a circuit design support method for designing the layout of electronic components on a circuit board based on voltage and/or heat distribution information on the circuit board, in which a voltage level or heat level at a position where a component selected by a user is located is compared with the noise generation level or heat generation level of the component to judge whether or not the component will generate noise and/or exceed predetermined temperature, and accordingly it is determined whether or not to place the component at the position.

According to a seventh aspect of the present invention, there is provided a program for implementing the device or system in one of the first to third aspects, wherein a program read out of a recording medium is executed to implement the first, second or third component locating means in the first or second aspect.

BRIEF DESCRIPTION OF THE DRAWINGS

The objects and features of the present invention will become more apparent from the consideration of the following detailed description taken in conjunction with the accompanying drawings in which:

FIG. 1 is a block diagram showing a configuration of a circuit design supporting device according to a prior art;

FIG. 4 is a table showing a data configuration in a component library 3 used in the first embodiment;

FIG. 8 is a table showing a data configuration in the category-by-category level database 31 used in the first embodiment;

FIG. 10 shows an example of a candidate component list provided to a user through a displaying section 2 used in the first embodiment;

FIG. 11 is a table showing a data configuration in a located component database 32 used in the first embodiment;

FIG. 12 is a table showing a data configuration in a printed circuit board database 33 used in the first embodiment;

FIG. 16 is a table showing a data configuration in a component library 30 used in the second embodiment;

FIG. 18 is a table showing a data configuration in a pin-by-pin level database 301 used in the second embodiment;

DESCRIPTION OF THE PREFERRED EMBODIMENTS

Figure 2A:
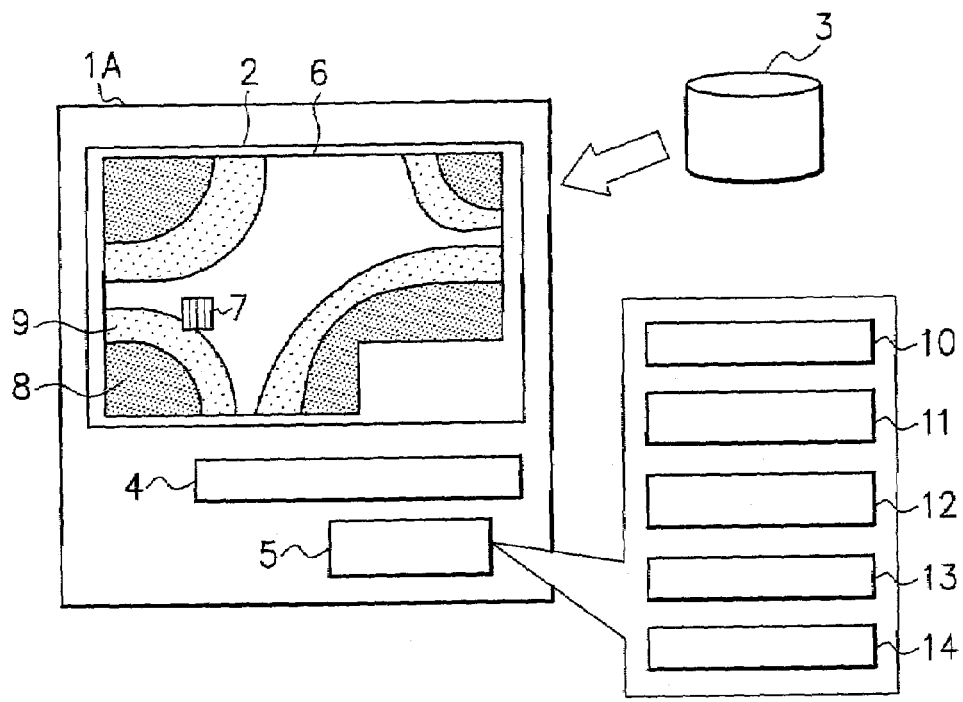
FIGS. 2A and 2B are block diagrams respectively showing a configuration of a circuit design supporting device according to a first embodiment of the present invention, FIG. 2A showing a case where a component is located on a printed circuit board, and FIG. 2B showing a case where a plurality of components and/or chips (of the single or plural kinds) are located on a printed circuit board)

Referring now to the drawings, embodiments of the present invention will be explained in detail.

The present invention relates to a device, a system, a server, a client, and a method for supporting a component layout design so as to suppress unnecessary electromagnetic radiation (interference) when designing a layout of components (electronic components and microchips) on a circuit board such as a multilayer printed circuit board, and a program for implementing the device.

The device for supporting a component layout design on a circuit board can be used as the server and the client(s) for the same.

Moreover, by the method for supporting the layout design of components on a circuit board based on voltage and/or heat distribution information on the circuit board, a voltage level or heat level at a position where a component selected by a user is located is compared with the noise generation level or heat generation level of the component to judge whether or not the component will generate noise and/or exceed predetermined temperature, and accordingly it is determined whether or not to place the component at the position.

Furthermore, the program implements the device or system for supporting the layout design of components on a circuit board. Besides, by the program, a program read out of a recording medium is executed to implement a component locating means.

The unnecessary electromagnetic radiation (interference) arises from resonance generated between a power source plane and a ground plane of a printed circuit board. The resonance is caused by oscillation of voltage or current, the oscillation being generated by a rapid change of voltage, etc. when switching signals.

When locating a component that becomes a load on wiring having such resonance, the resonance is increased. Moreover, the resonance is increased as a value of current passing through a located component becomes larger.

In another respect, the present invention intends to provide a device, a system, a server, and a client for supporting a design of a printed circuit board so as not to generate resonance, a method for supporting a design of a circuit and a program for realizing the device.

In the present invention, voltage distributions in (on) a multilayer printed circuit board are presented to a designer (user) with respect to each voltage level. In consideration of the voltage distributions, the designer determines a position of a component to be located. Thereby, it becomes possible to locate a component in a position where the resonance will not be generated between a power source plane and a ground plane. Consequently, it becomes possible to design a printed circuit board wherein unnecessary electromagnetic radiation is suppressed.

Figure 2B:
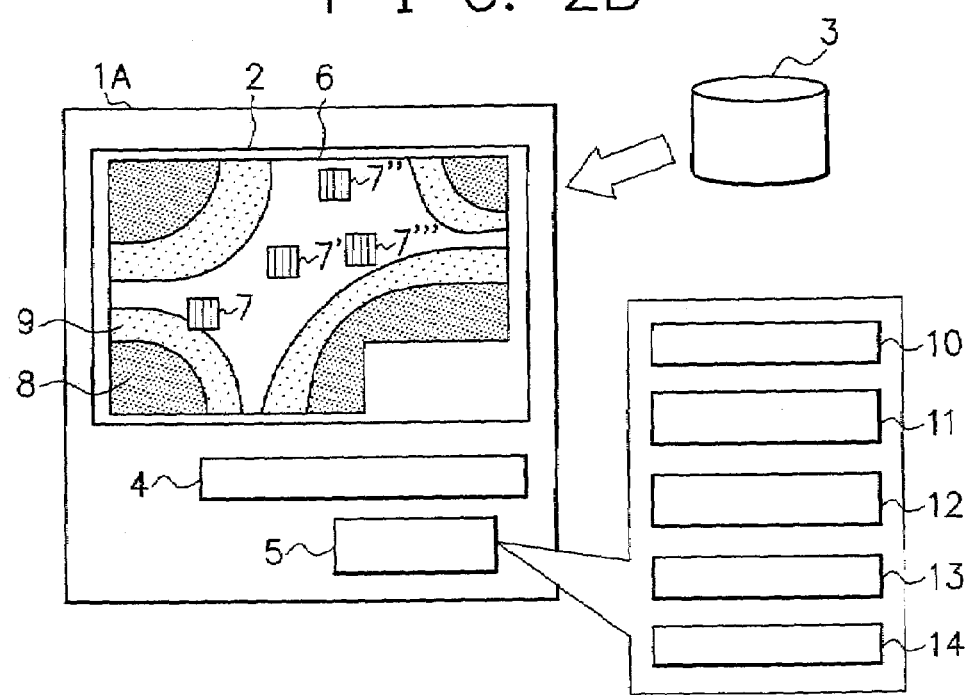

FIGS. 2A and 2B shows a circuit design supporting device according to the present invention, respectively, FIG. 2A showing a case where a component is located on a printed circuit board, and FIG. 2B showing a case where a plurality of components (the kind of the components may be single or plural) are located on a printed circuit board.

As shown in FIGS. 2A and 2B, the circuit design supporting device 1(A) comprises a displaying section 2, a noise generating level information adding means 4, and a component locating means 5. In FIG. 2A, on the displaying section 2 used in this device 1, there are displayed a printed circuit board 6, and a component 7 positioned on the printed circuit board 6. In addition to the above-described displays, voltage distributions 8 and 9 between a power source plane and a ground plane, etc. are displayed on the displaying section 2. Besides, a circuit design supporting system according to the present invention includes the above-described circuit board design supporting device 1 and a component library 3. The circuit board design supporting device 1 and the component library 3 may be connected to each other via a network, a LAN (local area network), a WAN (wide area network), etc., or directly connected to each other by wire or by air (wireless).

The component locating means 5 includes a component position detecting section 10, a component position voltage distribution detecting section 11, a noise generating level comparing section 12, an error informing section 13, and a component locating function section 14.

A designer selects a component 7 from the component library 3 to newly locate the component 7 on the printed circuit board 6, or selects a component 7 to replace a component on the printed circuit board 6 with the component 7. Subsequently, the designer determines a location of the selected component 7 in consideration of the voltage distributions 8 and 9, etc. on the printed circuit board 6 displayed on the displaying section 2 and information from the error informing section 13 in the component locating means 5. A component can be located on a printed circuit board in a position having lower voltage level so as to suppress the resonance. Moreover, a component having the possibility of generating (creating) noise can be relocated in a position causing no resonance. Thereby, it becomes possible to design a circuit board wherein unnecessary electromagnetic radiation between a power source plane and a ground plane can be suppressed.

Further in the present invention, the noise generating level information adding means 4, the component locating means 5, and the component library 3 in the circuit design supporting device 1(A) shown in FIGS. 2A and 2B can be stored in a storing means used by the circuit design supporting device 1. Moreover, the adding means 4, the locating means 5, and the library 3 can be configured as a file server (or database) connected to the circuit design supporting system (or device) 1 via a network. The adding means 4, the locating means 5, etc. may be configured so that the means can be booted up by executing a program read out from the storing means, etc. according to need during its run-time to fulfill the functions of the means. By this means, it is possible to configure the locating means 5, etc. by software, and further, it is possible to dispose the locating means 5, etc. physically independently. Incidentally, the number and the kind of the component 7 to be mounted on a circuit board may be the singular number or the plural number. However in the present invention, it is preferable there are a plurality of components 7 and kinds thereof. Moreover, when a plurality of components 7 are mounted on a printed circuit board, the same number of records as that of the plural components 7 may be stored in the component library 3. However in the present invention, when the plural components 7 of a kind are used, it is preferable to keep one record for the plural components 7. Thereby, it becomes possible to reduce storage capacity of the component library 3, and to miniaturize the component library 3.

Hereinafter, with reference to the drawings, an explanation will be given of a device, etc. for supporting a component layout on a circuit board according to embodiments of the present invention.

First Embodiment

In this embodiment, the supporting device 1(A) for designing a layout of components (electronic components and microchips) on a circuit board shown in FIGS. 2A and 2B is configured as a standalone type. However, even when the device 1 is configured as a standalone type, the device 1 can be connected to the component library(ies), etc. via a network or by using a LAN adapter, etc., and thereby, it becomes possible to share the library(ies), etc. (including a database) easily among users.

Figure 3:
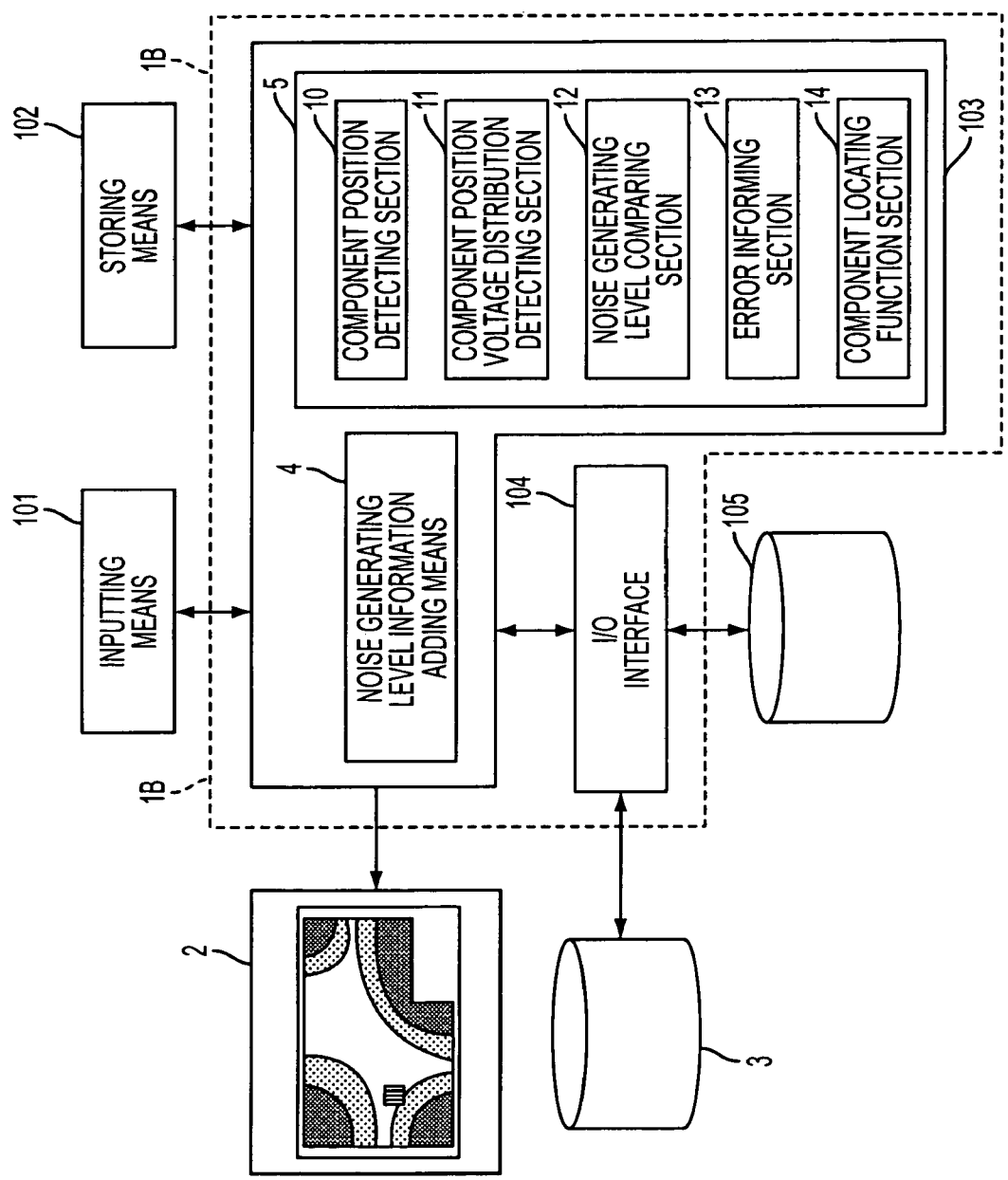
FIG. 3 is a block diagram showing a detail configuration of the circuit design supporting device according to the first embodiment.

FIG. 3 is a block diagram showing a configuration of the first embodiment of the present invention. As shown in FIG. 3, the device 1 for supporting a component layout design on a circuit board comprises a displaying section 2, a component library 3, an inputting means 101, a storing means 102, an arithmetic processing section 103, an I/O (input and output) interface 104, and a recording medium 105.

As shown in FIG. 3, the arithmetic processing section 103 includes the noise generating level information adding means 4 and the component locating means 5. The arithmetic processing section 103 is preferably configured by a CPU (central processing unit), etc. Moreover, it is preferable for the processing section 103 to read in a program stored in the recording medium 105 through the I/O interface 104 so as to acquire a working area in the storing means 102, and to form (and implement) the noise generating level information adding means 4 and the component locating means 5. The recording medium 105 is a nonvolatile recording medium such as a hard disk.

The noise generating level information adding means 4, which is formed by the arithmetic processing section 103 executing the program, is provided for adding noise generating level information to each component stored in the component library 3. For example, when the component library 3 is configured by a relational database, each record in the database is referred to one by one, for example, on a round-robin basis. Subsequently, a noise generating level for each component is calculated or extracted, and the noise generating level is stored in a corresponding record as the noise generating level information. The operation of the noise generating level information adding means 4 will be explained later.

As shown in FIGS. 2A and 2B, the component locating means 5 includes a-component position detecting section 10, a component position voltage distribution detecting section 11, an noise generating level comparing section 12, an error informing section 13, and a component locating function section 14. On the basis of a voltage distribution in a position where a component selected by a user (designer) is positioned and the noise generating level of the selected component, the component locating means 5 decides a noise level generated by the component in the present position, and determines whether or not the component has the possibility of generating noise. As the result of the determination, when the locating means 5 determined that the component would become a noise source, the locating means 5 informs the user of the error. Otherwise, the locating means 5 locates the component at the present position.

In this embodiment, the device 1 is preferably configured by a terminal such as an electron computer, and further, the component library 3 is stored in the terminal. Moreover, it is preferable to connect the library 3 to the arithmetic processing section 103 via the I/O interface 104.

The component library 3 stores components that are to be located on a printed circuit board in a database. FIG. 4 shows an example of a data configuration of the component library 3 used in this embodiment.

As shown in FIG. 4, the data configuration of the component library 3 in this embodiment is such that attributes of a "component ID" for identifying each candidate component to be located on the printed circuit board 6, a "category", a "name", a "type", a "standard", a "shape (size)", "noise generating level information", etc. are stored as one and the same record with respect to each component. While in an example of the configuration in FIG. 4, the components are disposed with respect to each category in the numerical order from the top, the components may be disposed in any order.

The above-described attributes of "category", "name", "type", and "standard" are stored in the component library 3 as information provided to a user. The attribute information includes "component ID", "noise generating level information", etc., which is used for error determination by the noise generating level comparing section 12. The attribute information of "standard" can be used when calculating the noise generating level. The attribute information of "standard" includes a value of current passing through a component in operation, and the noise generating level can be calculated on the basis of the current value. Incidentally, it is possible to directly use information (attributes) provided from manufacturers to the public.

Moreover in this embodiment, a serial number (model number) assigned to each component by a manufacturer can be directly used for the attribute of "component ID". Thereby, it becomes possible for a user or a provider of the device 1 to save the trouble of assigning a new number to each component, and further, it becomes possible for the user to utilize knowledge acquired in the past for other operation, etc.

In the field of the attribute "shape (size)", there is given detailed descriptions of an outline of a component, a size of each side, etc., which are described by the exact size or the scale size in conformity to the scale ratio on a printed circuit board.

The noise generating level stored in the field of the attribute "noise generating level information" indicates a voltage level where each component causes noise. The noise generating level is compared to a value of resonance voltage between a power source plane and a ground plane by the noise generating level comparing section 12. The noise generating level indicates a minimum value where, when locating a component on the printed circuit board 6, the component causes resonance between the power source plane and the ground plane (in other words, the component creates noise). While in this embodiment the noise generating level is represented by a value of a voltage level, the noise generating level may be represented by another value. In short, the noise generating level comparing section 12 executes error determination using the value of resonance voltage, and determines that the resonance arises (a component generates noise) when a voltage (or another value which is reducible to a voltage) is equal to or larger than the value of resonance voltage.

The value of the voltage level used as the noise generating level information can be calculated by general rules, by way of experiment, or by way of experience, and is used for determining whether or not a component generates noise when the component is located. Incidentally, regarding the setting of the value of the voltage level, the device 1 on the provider's side may store a value of the voltage level in advance as a default value so that each user can set again the value later.

The value of current passing through a component has close relevance to the noise generation. Generally, a component through which a lot of current passes is highly likely to generate (create) noise. However, this relationship is not necessarily applied to every kind of components. Therefore, regarding the setting of the current value, when calculating a noise generating level using a value of current passing through a component, the device 1 on the provider's side may store a current value in advance as a default value so that each user can set again the current value later as with the above-described case of dealing with the value of the voltage level. Moreover, when newly registering a component in the component library 3, it is also possible to use a current value given in the product specification of the component in the early stage. Thereby, the setting of the current value becomes more convenient for users as with the above case.

With this configuration of this embodiment, the noise generating level comparing section 12 determines an error by comparing the noise generating level of each component stored in the component library 3 with the voltage level in the position where each component is located.

Incidentally, if the component library 3 is configured by a relational database, there are included in the one and the same record the attributes of "component ID", "shape (size)", and "noise generating level information", etc. The library 3 can be also configured by a plain file format.

The I/O interface 104 executes writing in external sections such as the recording medium 105 and the component library 3, etc. and reading out therefrom on the basis of instructions from the arithmetic processing section 103 (the noise generating level information adding means 4).

In this embodiment, as shown in FIG. 3, there are disposed the displaying section 2 and the inputting means 101. The displaying section 2 displays the same things as those in FIG. 2A. The inputting means 101 is disposed so that a user can input each instruction. For example, through the inputting means 101, the user inputs instructions to select a component to be located on the printed circuit board 6 and to determine the position of the component.

In the following, an explanation will be given of operation of the first embodiment in detail. The operation will be explained by citing an example of configuring each database (including the electronic library 3) by a relational database. However, it is also possible to configure each database by a plain file format.

First, an explanation will be given of operation of the noise generating level information adding means 4 used in this embodiment. The noise generating level information adding means 4 determines noise generating level of each component stored in the component library 3, and stores the level in each record as the noise generating level information. The principal operation is shown in a flowchart in FIG. 5.

Figure 5:
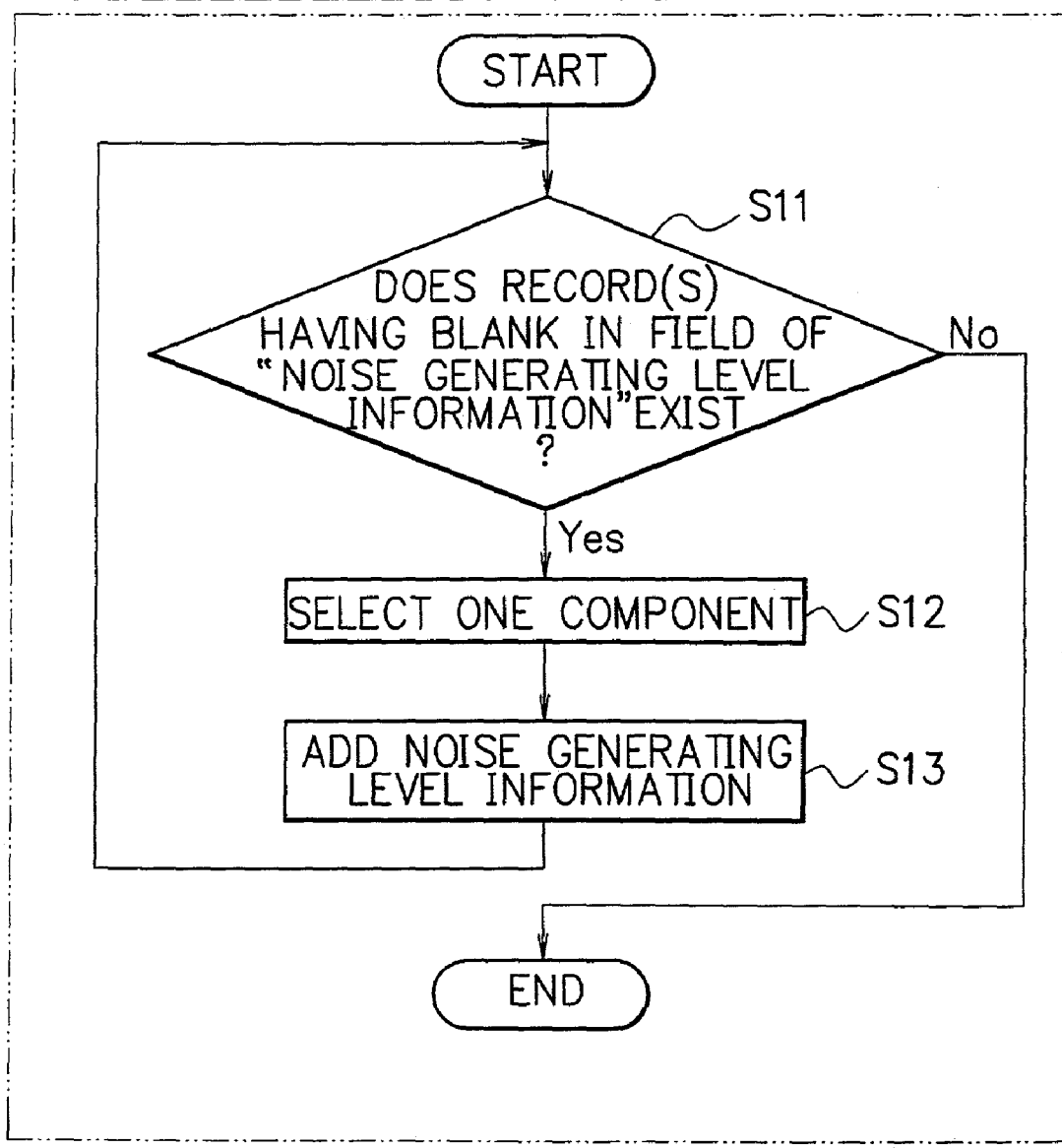
FIG. 5 is a flowchart showing main operation of a noise generating level information adding means 4 used in the first embodiment.

As shown in FIG. 5, the noise generating level information adding means 4 refers to the field of "noise generating level information" of each record in the component library 3 to determine whether or not there exists a record(s) having a blank in the field (Step S11). As a result of the determination, when a record(s) having a blank in the field exists (Yes in Step S11), the adding means 4 selects, from the record(s) having a blank, a record (component) one by one (the record may be selected in any order) (Step S12). Subsequently, the adding means 4 adds the noise generating level to the selected record (Step S13). After that, the operation returns to Step S11, and it is determined whether or not there exists another record having a blank "noise generating level information" field as with the above description. Until all of the blanks in the field are filled (No in Step S11), the adding means 4 repeats Steps S11 to S13. Incidentally, in the operation shown in FIG. 5, when it is not known exactly whether a user intentionally inputs nothing in the field of "noise generating level information", the noise generating level information adding means 4 can write a null in all blanks to fill in the blanks at a time. Alternatively, the adding means 4 may indicate in advance a record(s) having a blank field to confirm whether the user intentionally inputs nothing in the field. After obtaining the confirmation, the adding means 4 can execute processing to fill a blank(s) to which a null should be inputted at a time or one by one. The processing to fill the blank(s) may be executed when the user confirms whether the user intentionally inputs nothing in the field. Moreover, when the user confirms whether the user intentionally inputs nothing in the field, the user can input data in a field that should be filled. Incidentally, these processing is executed after there exists a blank in the field of "noise generating level information".

In Step S12, when selecting an object component (record) to which noise generating level information is to be added, the adding means 4 can select a component in any order, for example, on a round-robin basis.

Moreover in Step S12, the noise generating level information to be added to the selected component can be determined, for example, on the basis of a value of current passing through an object component as described above, or set in advance with respect to each category of components. When calculating a noise generating level on the basis of the current value, the value of current passing through an object component is identified by referring to the field of "standard" stored in the same record. Subsequently, the noise generating level is calculated on the basis of the current value, and the calculated noise generating level is stored in the filed of "noise generating level information" as the noise generating level information. On the other hand, when setting in advance a noise generating level with respect to each category of components, at the time of adding a noise generating level information, for example, a category-by-category level database 31 is referred to using the filed of "category" in the same record of the object component as a key to specify the noise generating level. Subsequently, the specified noise generating level is stored in the field of the "noise generating level information". The configuration of the category-by-category database 31 will be explained later.

The flow in FIG. 5 can be executed every time a record of a new component is registered in the component library 3, or executed when the number of inputs into the library 3 reaches a steady value. For that purpose, it is preferable to set a step of determining whether or not the library 3 is updated or whether or not the number of valid inputs to the library 3 exceeds the constant value at the starting of the device 1 or during its performance. Subsequently, the flow in FIG. 5 can be executed by the detection of the update of the library 3 or the excess of the number over the constant value as a trigger when the step is executed.

Figure 6:
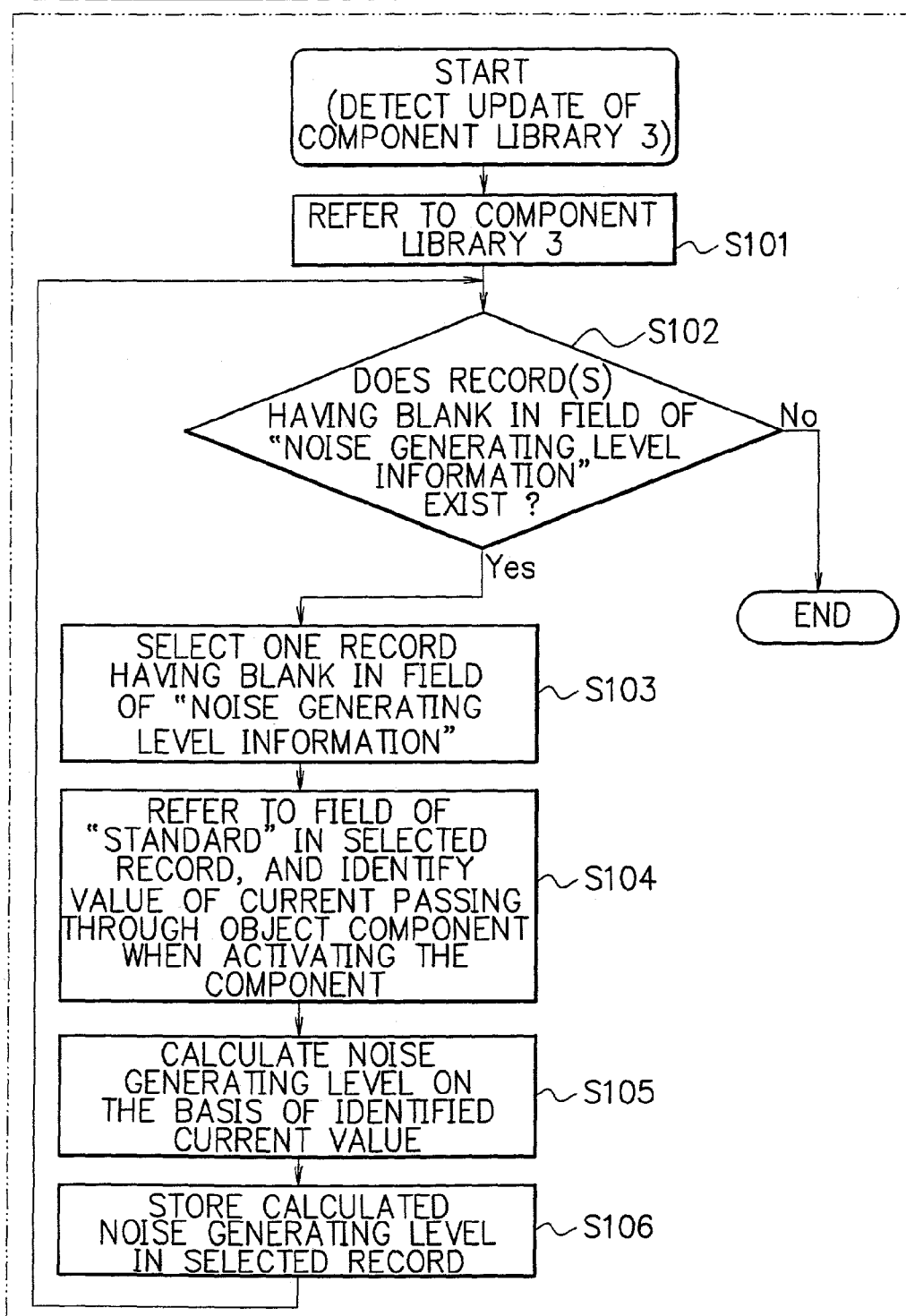
FIG. 6 is a flowchart showing operation of the noise generating level information adding means 4 when identifying a noise generating level on the basis of a value of current passing through each component, the current value being stored in a field of "standard" in the component library 3, used in the first embodiment.

Moreover in the flow in FIG. 5, here is an explanation of a case of calculating a noise generating level to be added on the basis of the current value referring to FIG. 6. In FIG. 5, a user calculates a noise generating level or determines a noise generating level on the basis of information provided by a manufacture, and the user adds the calculated or determined noise generating level to a corresponding component or the noise generating level information adding means 4 adds the noise generating level thereto according to the input of the noise generating level from the user. In the following example as shown in FIG. 6, etc., a noise generating level is added to a component. The explanation will be explained.

The operation in FIG. 6 is triggered by the detection of the update of the component library 3. In this operation, first, the noise generating level information adding means 4 refers to each of the records stored in the library 3 (Step S101). Subsequently, the adding means 4 determines whether or not there exists a record(s) having a blank in the field of "noise generating level information" as described above (Step S102). As a result of the determination, when there exist a record(s) having a blank in the field (Yes in Step S102), the adding means 4 selects one of the records (Step S103). When selecting one record, either the above-described round robin method or another well known method can be used.

Subsequently, the adding means 4 refers to the field of "standard" in the specified record, and identify a current value (a value of current passing through the object component when activating the component) included in the filed of "standard" (Step S104). After that, the adding means 4 calculates a voltage level serving as a noise generating level on the basis of the identified current value (Step S105). Then, the adding means 4 stores the calculated noise generating level in the record (Step S106).

On the other hand, as a result of the determination in Step S102, when there is no record having a blank in the field of "noise generating level information" (No in Step S102), the adding means 4 finishes the series of the processing.

Here an explanation will be given of operation of the noise generating level information adding means 4 in the case of setting in advance a noise generating level with respect to each category of components referring to FIG. 7. For example, in the flow of FIG. 6, a noise generating level is stored in advance with respect to each category of components in the category-by-category level database 31, and noise generating level information is added to the record of an object component using the noise generating level in the category-by-category level database 31.

Figure 7:
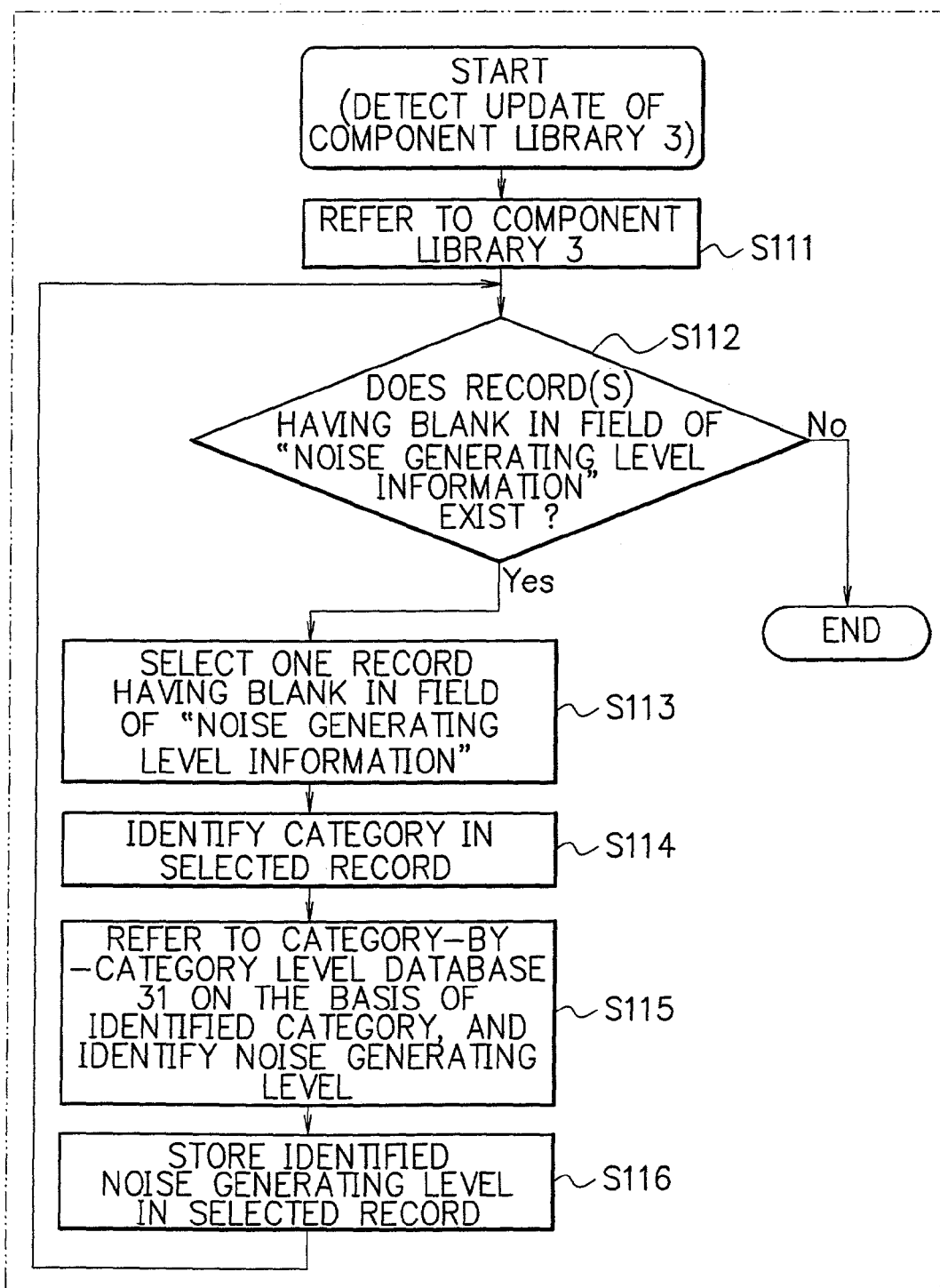
FIG. 7 is a flowchart showing operation of the noise generating level information adding means 4 when identifying a noise generating level using a category-by-category level database 31 used in the first embodiment.

As shown in FIG. 7, this operation is triggered by the detection of the update of the component library 3 as with the flowchart shown in FIG. 6. The operation from Steps S111 to S113 shown in FIG. 7 is the same as that from Steps S101 to S103 shown in FIG. 6.

After Step S113, the adding means 4 refers to the field of "category" in the selected record, and identifies the category of the object component (Step S114). After that, the adding means 4 refers to a category-by-category level database 31 shown in FIG. 8 on the basis of the identified category of the object component, and identifies the noise generating level (Step S115). Then, the adding means 4 stores the identified noise generating level in the field of "noise generating level information" in the record selected in Step S113 (Step S116).

On the other hand, when there is no record having a blank in the field of "noise generating level information" (No in Step S112), the adding means 4 finishes the series of the processing.

Next, an explanation will be given of the category-by-category level database 31 referred to by the noise generating level information adding means 4 referring to the drawing.

FIG. 8 shows an example of a data configuration of the category-by-category level database 31 used in this embodiment. As shown in FIG. 8, the category-by-category level database 31 includes attributes of "category" and "noise generating level information". Both attributes "category" and "noise generating level information" are the same as those in the component library 3 shown in FIG. 4. By setting the "category" in the library 3 as a primary key, it becomes possible to refer the category-by-category level database 31.

By the operation of the noise generating level information adding means 4 as described above, noise generating level information is added to all of the records stored in the component library 3. Incidentally, the adding means 4 may add the information arbitrarily to the records of components (microchips), for example, the adding means 4 may add noise generating level information only to necessary components.

Next, an explanation will be given of operation of the component locating means 5 used in this embodiment referring to the drawings.

Figure 9:
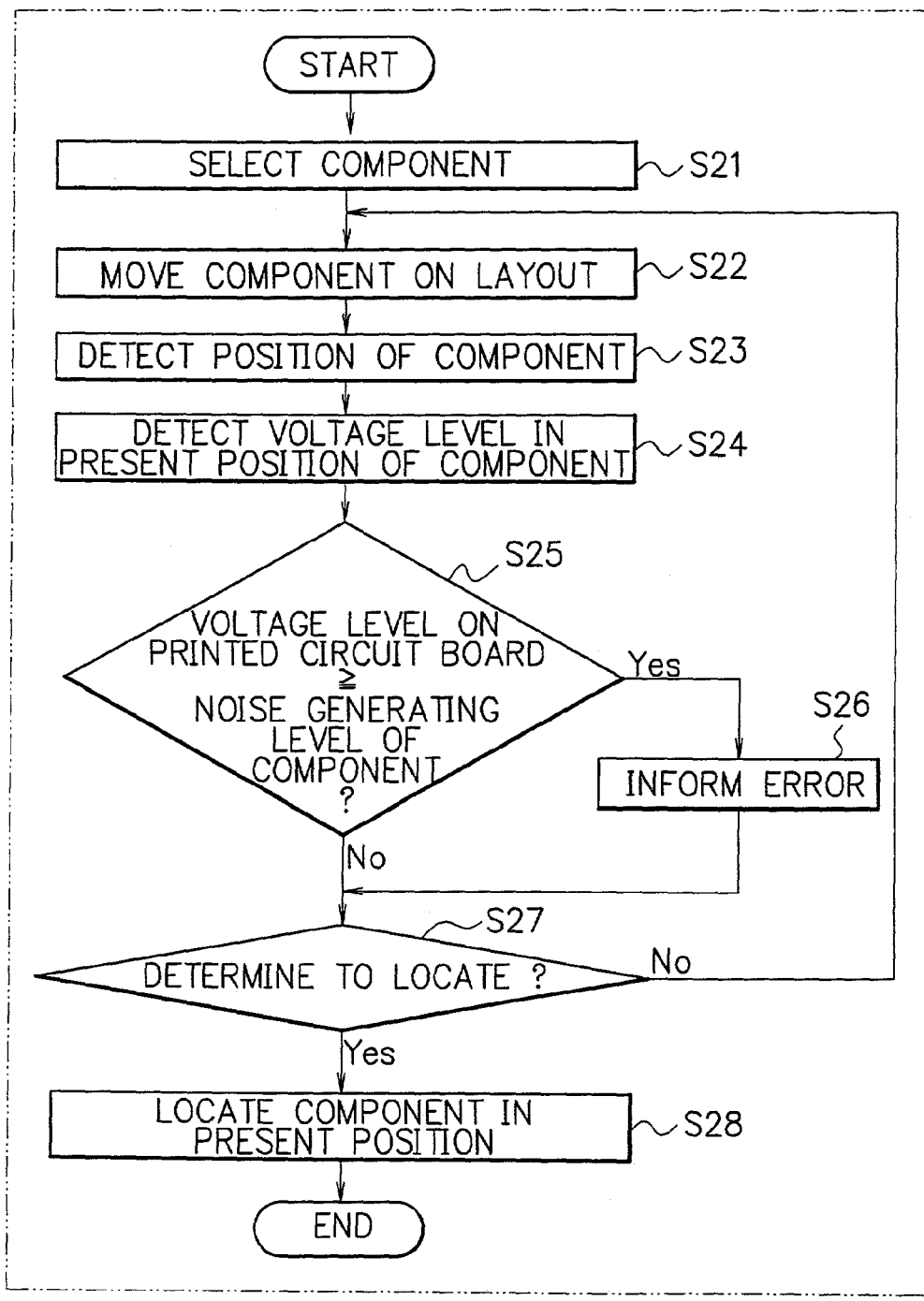
FIG. 9 is a flowchart showing operation of a component locating means 5 used in the first embodiment.

FIG. 9 is a flowchart showing operation of the component locating means 5 used in this embodiment. As shown in FIG. 9, first, the component locating means 5 lets a user (designer) select at least one component 7 to be located on the printed circuit board 6 from components stored in the component library 3 (Step S21).

After the user selects a component 7 to be located on the printed circuit board 6 in Step S21, the component locating means 5 identifies the information (attributes) such as the "shape (size)" stored in the component library 3, etc. on the basis of the component ID of the selected component 7 to restore and display the component 7 on the printed circuit board 6 displayed on the displaying section 2 in FIG. 3. Incidentally, the starting position of the selected component 7 when restoring and displaying the component 7 on the printed circuit board 6 can be anywhere on the printed circuit board 6. For example, the selected component 7 can be displayed at the center of the displaying section 2 as the starting position. After that, the locating means 5 moves the component 7 on the basis of instructions issued from the user through a GUI (graphical user interface) such as a mouse and a keyboard (Step S22). By this means, the user can drag the component 7 using the GUI. Incidentally, when one area or several areas where the component 7 does not generate noise is left on the printed circuit board 6, the component 7 can be located at the area or one of areas automatically. For example, after some components 7, 7', . . . , was located, and when at least one area where a newly located component 7" does not generate noise is left, it is possible to make a program so as to determine to locate the component 7 at the area (when there are a plurality of candidate areas, at any one of areas) automatically, and to ask a user whether or not to locate the component 7 at the area.

Subsequently, the component position detecting section 10 in the locating means 5 detects the present position of the component 7 on the printed circuit board 6 (Step S23). When identifying the present position of the component 7 in Step S23, for example, the detecting section 10 may start to detect the position of the component 7 triggered by the move of the component 7 by a predetermined distance in Step S22. For another example, the detecting section 10 may start to detect the position when a predetermined time has passed on the basis of a timer (not shown), etc.

After the detecting section 10 detects the present position of the component 7 on the printed circuit board 6 in Step S23, the component position voltage distribution detecting section 11 in the locating means 5 detects a voltage level (distribution) in the present position of the component 7 on the printed circuit board 6 (Step S24).

After the detecting section 11 detects the voltage distribution, the noise generating level comparing section 12 in the component locating means 5 refers to the field of "noise generating level information" of the component 7 in the library 3 to identify the noise generating level on the basis of the component ID of the component 7. Subsequently, the noise generating level comparing section 12 compares the identified noise generating level with the voltage level detected in Step S24 (Step S25).

As a result of the comparison in Step S25, when the voltage level in the present position on the printed circuit board 6 is equal to or larger than the noise generating level, namely, when there is a risk of generating noise between a power source plane and a ground plane on the printed circuit board 6 owing to the component 7 (Yes in Step S25), the component locating means 5 informs the user of the error on the displaying section 2 through the error informing section 13 (Step S26), and proceeds to Step S27. The informing section 13 can inform the user of the error, for example, by highlighting the component 7 with a red color (in the case where the component 7 has been displayed with a non-highlighted color such as a white under normal conditions). Further, the informing section 13 can inform the user of the error with a buzzer and by displaying characters, etc. indicating the error on the displaying section 2.

On the other hand, when the voltage level in the present position on the printed circuit board 6 is lower than the noise generating level, namely, there is no risk (or there is an extremely low risk) of generating noise between a power source plane and a ground plane on the printed circuit board 6 owing to the component 7 (No in Step S25), the component locating means 5 executes processing of whether or not to locate the component 7 at the present position (Step S27).

Subsequently, the component locating function section 14 in the locating means 5 shown in any one of FIGS. 2A, 2B, and 3 asks the user whether or not to fix the component 7 at the present position (Step S27). When the user determines to locate the component 7 at the present position (Yes in Step S27), the component locating function section 14 locates the component 7 in the position on the printed circuit board 6 (Step S28), and finishes the series of operation. On the other hand, when the user determines not to locate the component 7 at the present position (namely, when the user desires to move the component 7 to another position) (No in Step S27), the locating means 5 goes back to the processing of moving the component 7 on the basis of instructions from the user in Step S22.

In Step S27, the component locating means 5 can determine the position of the component 7 at the present position if at least one of the following conditions is satisfied, for example:

1. the voltage level in the detected voltage distribution on the printed circuit board 6 is lower than the noise generating level of the component 7 in Step S25;

2. the instructions for move (relocation) are not inputted from the user through a GUI such as a mouse within a predetermined time; and 3. after the component locating function section 14 asks the user whether or not to locate the component 7 at the present position, the user inputs the determination to locate the component 7.

Incidentally, the positional information, etc. of the component 7 located (or relocated) in Step S28 is stored in a located component database described later.

In this way, a user determines to locate (or relocate) the component 7 in a position causing no error with the component (the component 7 does not generate noise). Thereby, it becomes possible to design a layout of electronic components on a printed circuit board (circuit board) in which unnecessary noise will not be generated.

In Step S21 shown in FIG. 9, the user can select a component from a candidate component list. For example, when additionally locating a component on the printed circuit board 6, the arithmetic processing section 103 reads out categories (component categories A, B, . . . , etc.) from the field of "category" or names (components A1, A2, . . . , etc.) from the field of "name" of candidate components stored in the component library 3 to make the candidate component list and present the list to a user. Thereby, the user can select one component or chip from the candidate component list.

FIG. 10 shows an example of the configuration of the candidate component list compiled by reading out candidate component information from the component library 3 and presented to a user.

FIG. 10 is an example of the candidate component list in which components are classified by each category. As shown in FIG. 10, there are displayed data of "category", "name", "type", "standard", "shape (size)", and "noise generating level information" as attributes with respect to each candidate component. Each of the components are classified into the corresponding category (component categories A, B, . . . ,). These data (attributes) are the same as those stored in the component library 3. The information (data) are extracted by the arithmetic processing section 103, and processed so as to be displayed on the displaying section 2 as shown in FIG. 10. Regarding this processing, first, the arithmetic processing section 103 reads out the "component category A", "component category B", "component category C", . . . , from the domain of the attribute of "category" in the component library 3, and puts the items of category in the field(s) of "category" in the candidate component list. Next, the processing section 103 reads out, from the component library 3, the attributes of "name", "type", "standard", "shape (size)", "noise generating level information", etc. with respect to each component, and adds the read out attributes to the list. An incomplete list is stored in the storing means 102 shown in FIG. 3. By the above-described operation such that the arithmetic processing section 103 extracts information of candidate components from the library 3 to make a candidate component list, it becomes possible for a user to select a component to be located from the compiled list.

Incidentally, in this embodiment, it is preferable to set a located component database 32. In the located component database 32, there are stored examples of layout of components, layouts of components configured in the past, and so forth, on printed circuit boards. The user selects one printed circuit board on which at least one component has been located from the located component database 32. The selected printed circuit board is displayed on the displaying section 2 along with the component thereon. Subsequently, the user selects one component (or chip), drags the component using a GUI as described above, and preferably, moves the component to a desired position.

As shown in FIG. 11, the located component database 32 includes attributes of "component layout ID" as identification information for identifying a layout of components, "printed circuit board ID" as identification information for identifying a printed circuit board on which the component layout is set, "component ID" as identification information for identifying each component disposed on the printed circuit board, "positional information" indicating the position of each component disposed on the printed circuit board, and "wiring information" indicating wiring lines connecting the components disposed on the printed circuit board. The "printed circuit board ID" shown in FIG. 11 is set for relating information in the located component database 32 to that in a printed circuit board database 33, and used for specifying information of each printed circuit board such as its shape (size) and its configuration. The attribute "component ID" is the same as that stored in the component library 3. The attribute "wiring information" shows wiring lines having been relocated automatically or manually after a component(s) was located or relocated on a printed circuit board. The attribute "wiring information" can include a history of plural position changes of a component (including a position of pins set to a component).

Moreover as shown in FIG. 12, in the printed circuit board database 33, attributes of "printed circuit board ID" and "shape (size)" are included. The attribute of "shape (size)" includes information of a shape, size, etc. of each printed circuit board. When representing a layout of components selected by a user and displaying it on the displaying section 2, the component locating means 5 refers to the database 33 on the basis of the attribute of "printed circuit board ID" included in the record of the selected component layout in the located component database 32 to acquire the information of its shape, size, etc.

In this embodiment, when newly changing a position of a component having been set on a printed circuit board, the component locating means 5 recreates (represents) and displays the layout as one selected by a user with a component(s) set to the printed circuit board on the basis of the located component database 32 and the printed circuit board database 33. Subsequently, the user selects the component recreated and displayed on the displaying section 2 using a GUI such as a mouse and a keyboard, and moves the selected component using the same. Along with the change of the location of the component, the wiring lines may be relocated automatically or manually. The wiring lines can be relocated again manually after the wiring lines have been determined.

The attributes "printed circuit board ID", "component ID", "positional information" and "wiring information" of the changed printed circuit board are stored in the located component database 32 as a new record. At the time, a new "component layout ID" is added to the new record by the user or automatically, and stored in the same record.

Incidentally, the operation of the above-described relocation (or change of a located component) is the same as that shown in FIG. 9.

In Step S25 in FIG. 9 showing the flow of the processing by the component locating means 5, for example, the noise generating level comparing section 12 determines that resonance arises between a power source plane and a ground plane if the component 7 slightly overlaps an area of a voltage distribution (a voltage level) where the component 7 generates noise. Additionally, the noise generating level comparing section 12 may compare the highest voltage level in the area overlapped by the component 7 with the noise generating level of the component 7 to make a decision. Moreover, the noise generating level comparing section 12 may compare the highest voltage level on the printed circuit board 6 where one of pins set to the component 7 is located with the noise generating level of the pin to determine whether or not the component 7 generates noise.

Figure 22:
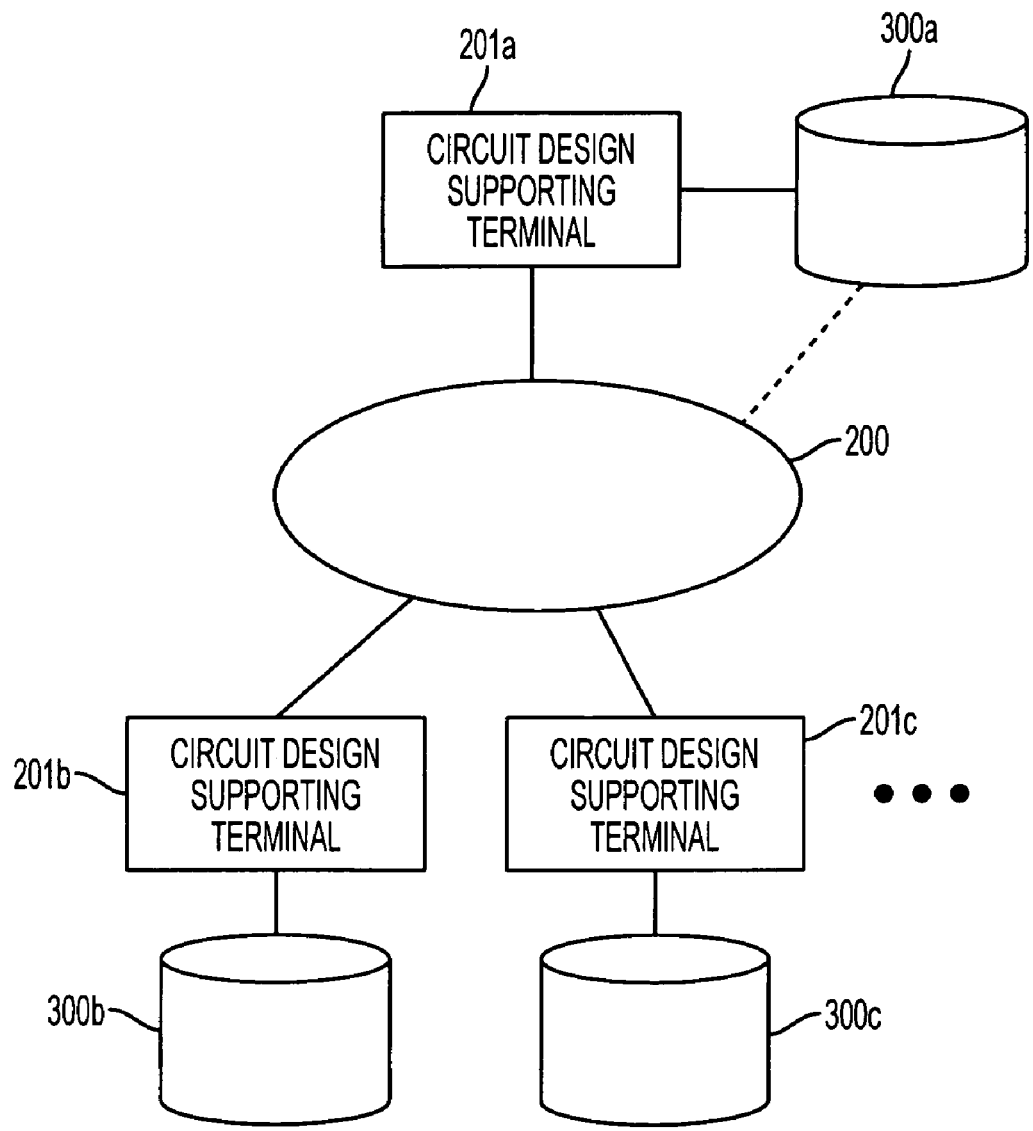
FIG. 22 is a block diagram showing a network configuration of a circuit design supporting system according to a third embodiment of the present invention.
Figure 23:
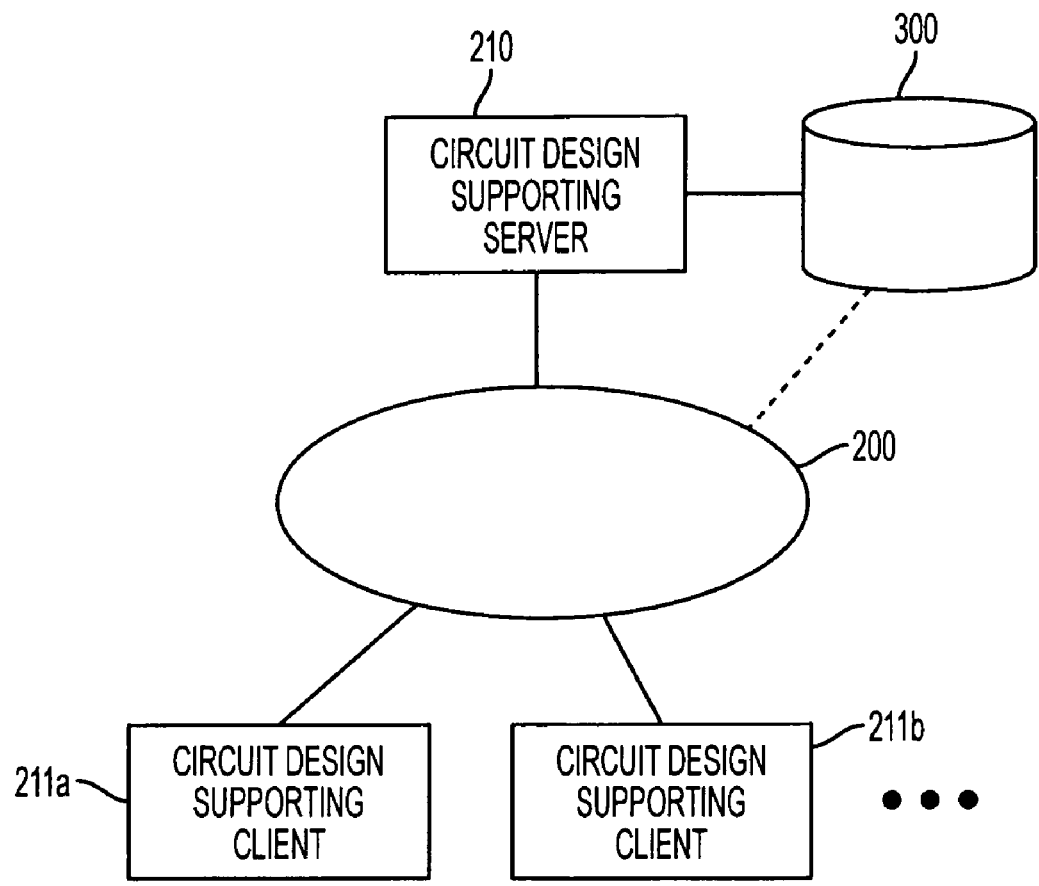
FIG. 23 is a block diagram showing a network configuration of a circuit design supporting system according to a fourth embodiment of the present invention.
Figure 24:
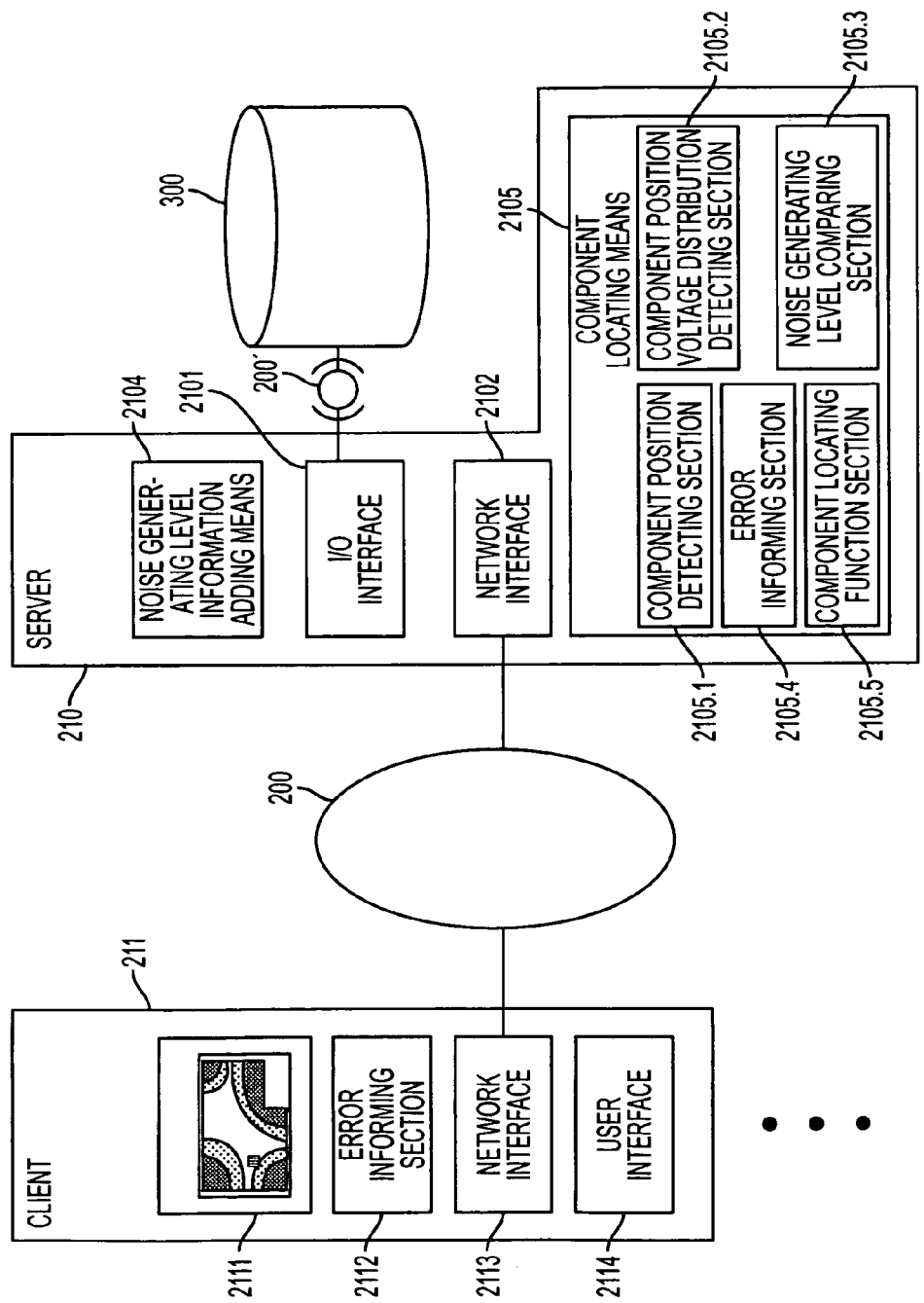
FIG. 24 is a block diagram showing a function configuration of the circuit design supporting system according to the fourth embodiment.

In this embodiment, the present invention has a system configuration shown in any one of FIGS. 22 to 24, or a device configuration such as the device 1A shown in FIGS. 2A and 2B or the device 1B shown in FIG. 3. For example, the component library 3 shown in FIGS. 2A and 2B may include the device 1A and an external device(s) electrically connected to each other (including a case where the devices are connected by the above-described LAN, WAN, etc. by wire or wireless), or may be connected to the device 1A via a network. Moreover as shown in FIG. 3, the arithmetic processing section 103 and the displaying section 2 may be independent. In this case, the device 1B includes the arithmetic processing section 103 and the I/O interface 104; the arithmetic processing section 103 is connected to the inputting means 101 and the storing means 102; and the library 3 is connected to the recording means 105 via the I/O interface 104. Incidentally, the inputting means 101, the storing means 102, the recording means 105 and the library 3 may be connected to the processing section 103 via the I/O interface 104, or may be directly connected thereto. Namely, the device 1 may comprise the displaying section 2, the library 3, the inputting means 101, the storing means 102, and the recording medium 105, and preferably, comprises the displaying section 2, the inputting means 101 and the storing means 102. Furthermore, the library 3 and the recording medium 105 may be connected to the device 1 as external devices via WAN, LAN, etc., or may be connected thereto via a network such as the Internet.

In this configuration, first, a user newly updates a component in the component library 3. Triggered by the update, an application is preferably started to fulfill the functions of the noise generating level adding means 4, and the adding means 4 refers to the component library 3. In this operation, the adding means 4 refers to the attribute of "noise generating level information" in the library 3 to determine whether or not there exists a record(s) having a blank in the field of the attribute of "noise generating level information". When there exists plural records each having a blank, the adding means 4 specifies one record of the records. After specifying the record having a blank in the field of "noise generating level information", the adding means 4 refers to the field of "standard" in the record, and identifies the value of current passing through the component when activated. Subsequently, after calculating a noise generating level on the basis of the identified current value, the adding means 4 newly stores the level in the record as the noise generating level information. Thereby, the noise generating level information is additionally stored in the record of the newly registered component. The adding operation for the attribute of "noise generating level information" in the library 3 is repeated, in principle, until all the blanks therein are filled up. Incidentally, the method for newly registering a component in the electronic library 3 and a method for specifying one record having a blank when there exists plural records is not limited to the above-described method. For example, these methods include a round-robin method as described above.

Next, an explanation in detail will be given of operation when selecting a component from the candidate component list compiled by records read out from the component library 3 to newly locate the component on the printed circuit board 6.

As shown in FIGS. 2A and 2B, the printed circuit board 6 is displayed on the displaying section 2 in the circuit design supporting device 1 used in this embodiment. Further, the voltage distributions 8 and 9 between a power source plane and a ground plane are displayed on the printed circuit board 6. A component 7 will not generate noise between a power source plane and a ground plane when located in the area of the voltage distribution 9, and meanwhile, the component 7 will generate noise therebetween when located in the area of the voltage distribution 8.

In this configuration, a user selects an object component 7 to be located on the printed circuit board 6 from the candidate component list compiled by records read out from the component library 3 using the component locating means 5. It is assumed that after the component 7 is selected, the starting position of the component 7 is at the center of the displaying section 2.

After the component 7 is displayed at the center of the displaying section 2, it becomes possible for the user to move the component 7 by, for example, dragging the component 7 using a mouse, etc. The user can also move the component 7 by using arrow keys on a keyboard.

After the user moves the component 7 on the printed circuit board 6, the component position detecting section 10 in the component locating means 5 detects the present position of the component 7. In this explanation of the present invention, the detection processing is triggered by the move of the component 7 by a predetermined distance.

After the present position of the component 7 on the printed circuit board 6 is detected, the component position voltage distribution detecting section 11 in the component locating means 5 detects the highest voltage value (the voltage distribution 9 in FIG. 2A) in the area overlapped by the component 7 on the printed circuit board 6. Subsequently, the noise generating level comparing section 12 in the component locating means 5 compares the detected voltage level (the voltage distribution 9) with the noise generating level of the component 7.

As a result of the comparison in the example of this description, the voltage level on the printed circuit board 6 in the area overlapped by the component 7 is less than a voltage level where the component 7 generates noise. Thereby, the error informing section 13 in the component locating means 5 does not inform the user of the error. Subsequently, the component locating function section 14 in the locating means 5 requires the user to determine whether or not to fix the component 7 at the present position. If instructions to fix the component 7 are inputted from the user in response to the requirement, the component locating function section 14 determines the position of the component 7 at the position shown in FIG. 2A. On the other hand, if instructions not to fix the component 7 at the present position (for example, instructions to relocate the component 7) are inputted from the user, the means 5 repeats the same operation after the user moves the component 7 by a predetermined distance. Incidentally, this operation will be executed until the instructions to fix the component 7 are inputted from the user.

Moreover, in the displaying section 2 in FIG. 2A, when the area occupied by the component 7 is overlapped with the area of the voltage distribution 8 on the printed circuit board 6, namely, when the component 7 is located in a position where the component 7 becomes a noise source, the error informing section 13 in the component locating means 5 warns the user about the error (that the component 7 has a higher possibility of generating noise) by highlighting the component 7 on the displaying section 2, for example, with a red color so as to stand out from other displays, and/or displaying a message indicating that there is a risk of increasing unnecessary electromagnetic radiation (interference) if the component 7 is located at the present position.

By the configuration and the operation of this embodiment as described above, it becomes possible to design a layout of main components such as an LSI wherein unnecessary electromagnetic radiation is suppressed. This is because it is possible to draw user's attention so as not to locate a component on a printed circuit board at a position where the component may cause resonance between a power source plane and a ground plane, which leads to unnecessary electromagnetic radiation.

Second Embodiment

Next, an explanation will be given of a device, a system, a server, and a client for supporting designing a layout of electronic components and chips on a circuit board such as a printed circuit board, a method for supporting designing a layout thereof, and a program for realizing the device according to a second embodiment of the present invention referring to drawings.

While in the first embodiment whether or not noise (unnecessary electromagnetic radiation) arises is determined with respect to each component (microchips), the determination is executed with respect to each pin set to a component in the second embodiment. A noise source is generally found in a position where a pin(s) connecting each component to wiring is located on a printed circuit board. Thereby, the device in this embodiment is configured so as to identify a position of a pin that has the possibility of generating (creating) noise more precisely.

Figure 13:
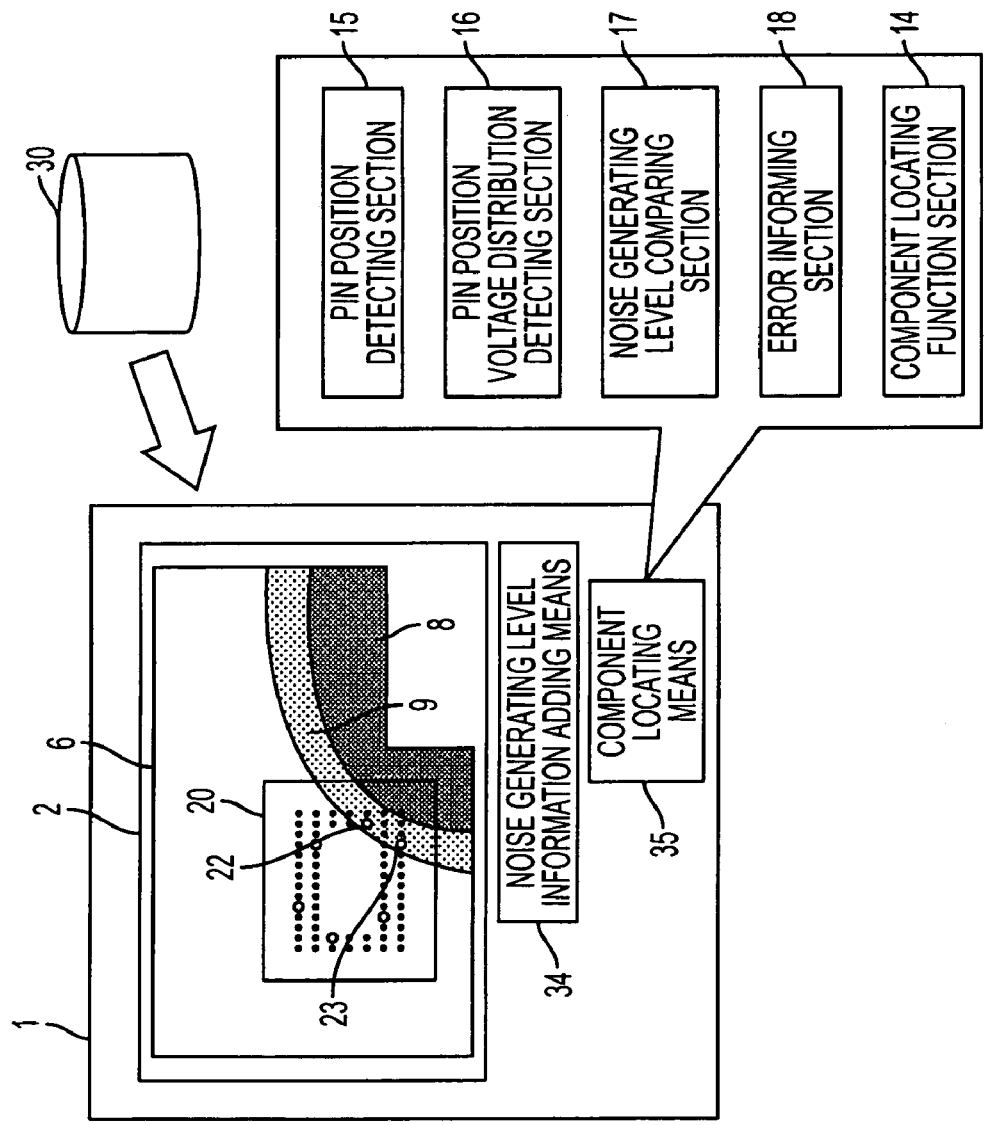
FIG. 13 is a block diagram showing a configuration of a circuit design supporting device according to a second embodiment of the present invention.

Referring to FIG. 13, an explanation will be given of a configuration of the second embodiment.

As shown in FIG. 13, the circuit design supporting device 1 according to this embodiment comprises a displaying section 2, a noise generating level information adding means 34, and a component locating means 35. The displaying section 2 displays a printed circuit board 6, a component 20, etc. The noise generating level information adding means 34 adds noise generating level information to each of the pins set to a component, the pins and the component being stored in a component library 30. The component locating means 35 determines whether or not each pin (or a component) generates noise to inform a user (designer) of the result of the determination.

Figure 14:
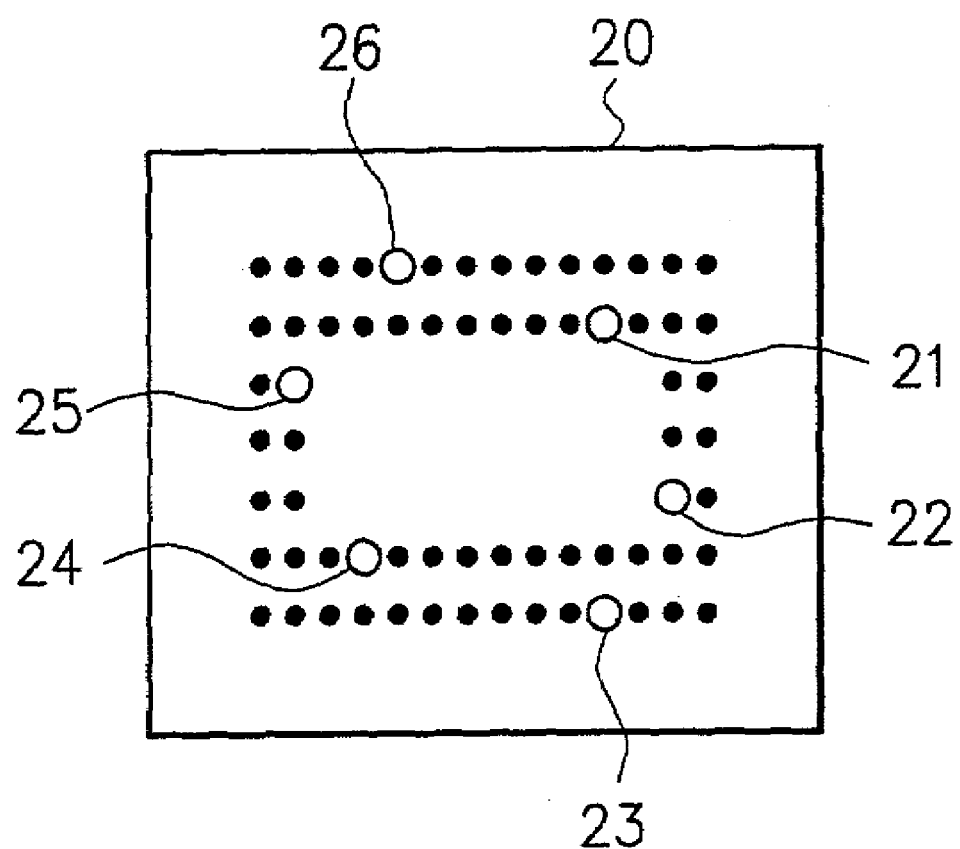
FIG. 14 is a block diagram showing a pin layout configuration of a component 20 used in the second embodiment.

In the component 20 shown in FIG. 14, if there exist six pins each having the possibility of generating noise among pins set to the component 20, the noise generating level information adding means 34 adds noise generating level information to each of the six pins. The added noise generating level information is managed and stored in a component library 30.

Moreover, as shown in FIG. 13, the component locating means 35 used in this embodiment includes a pin position detecting section 15, a pin position voltage distribution detecting section 16, a noise generating level comparing section 17, an error informing section 18, and a component locating function section 14. Furthermore, the component locating means 35 may includes a component position detecting section for detecting a position of a component. Incidentally, when a user determines a component to be located, the component position detecting section may not be included.

The pin position detecting section 15 detects a position of each pin set to a component 20 on the printed circuit board 6 displayed on the displaying section 2. The pin position voltage distribution detecting section 16 detects a voltage level in the detected position on the printed circuit board 6. The noise generating level comparing section 17 reads out a noise generating level from the component library 30 with respect to each pin, compares the read out noise generating level with the voltage level in the detected voltage distribution in a position of each pin, and determines whether or not the pin will generate noise with respect to each pin. The error informing section 18 may be configured so as to inform the user of an error with respect to each pin or with respect to each component. The component locating function section 14 operates as with the first embodiment.

In short, the component locating means 35 supports designing a layout of components (electronic components) on the printed circuit board 6 by comparing the noise generating level with the voltage level on (in) the printed circuit board 6 with respect to each pin set to the component 20 selected by a user, and subsequently executing error judgment.

Figure 15:
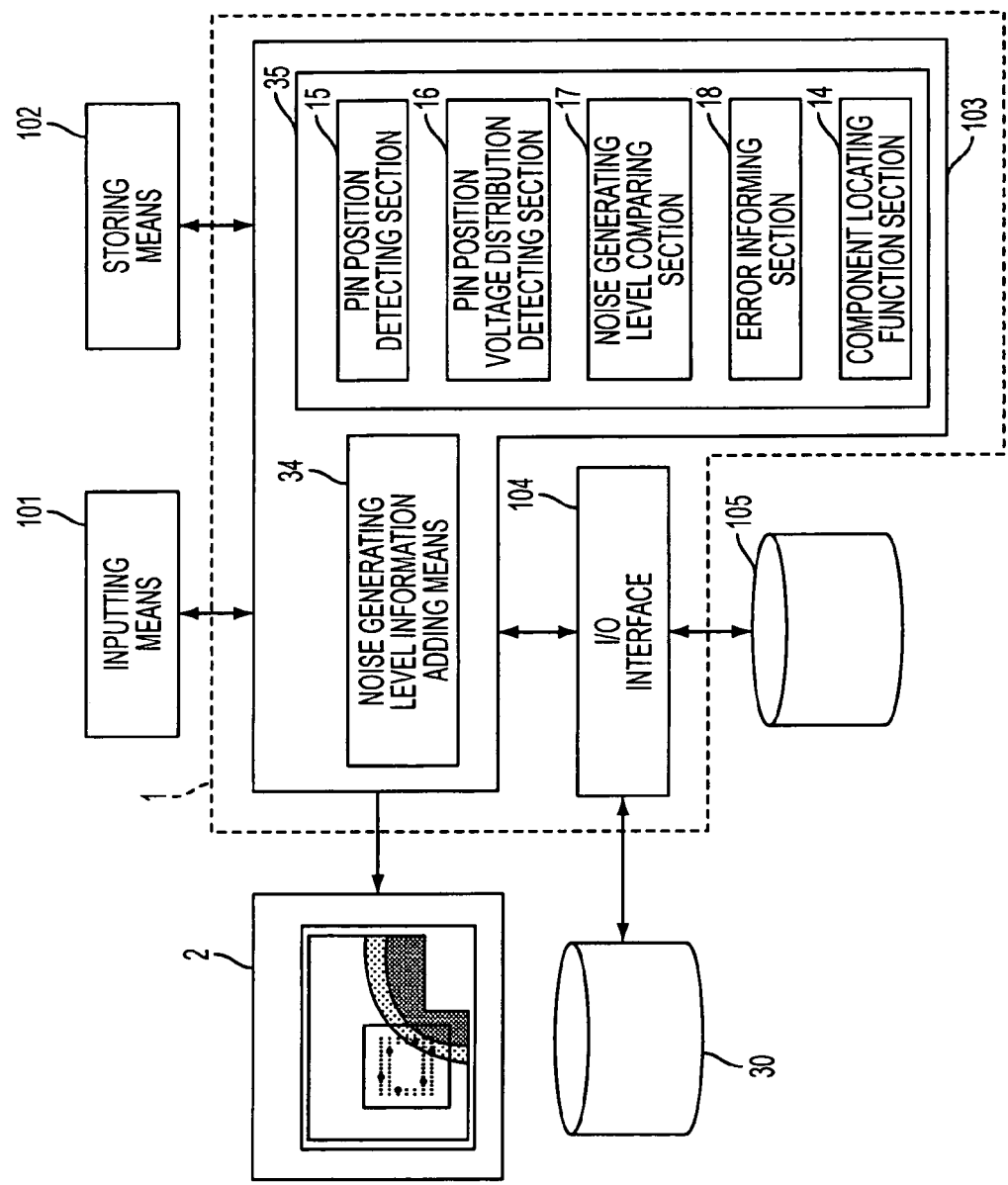
FIG. 15 is a block diagram showing a detail configuration of the circuit design supporting device according to the second embodiment.

Referring now to FIG. 15, an explanation will be given of an example of another configuration of the device 1 for supporting designing a layout of components on a circuit board (printed circuit board) according to the second embodiment in detail.

As shown in FIG. 15, the circuit design supporting device 1 according to this embodiment comprises the displaying section 2, the inputting means 101, the storing means 102, the arithmetic processing section 103, the I/O interface 104, the recording medium 105, and the component library 30, which can be connected to each other electrically by wire or wireless.

On the displaying section 2, the printed circuit board 6 and the component 20 are displayed as with FIG. 13. Incidentally, the pins set to the component 20 may be or may not be visibly displayed to the user through the displaying section 2. When the respective pins are visibly displayed to the user, it is preferable for the error informing section 18 to inform the error with respect to each pin.

The inputting means 101, the storing means 102, and the I/O interface 104 has the same configuration and operation as those explained in the first embodiment, and thereby, the explanation will be abbreviated.

The recording medium 105 may store an application program(s) to fulfill the functions of the noise generating level information adding means 34 and the component locating means 35 used in this embodiment. This program can be stored in another recording medium (not shown). The recording medium may be a temporary storage or a permanent storage, which can apply to other recording medium(s) and (a) storing means.

The arithmetic processing section 103 reads in the program stored in the recording medium 105 to fulfill the functions of the noise generating level information adding means 34 and the component locating means 35, and acquires a working area in the storing means 102.

In this embodiment, the noise generating level information adding means 34 adds noise generating level information with respect to each pin set to each component stored in the component library 30.

As shown in FIG. 16, when configured by a relational database as with the first embodiment, the component library 30 used in this embodiment stores attributes of "component ID", "category", "name", "type", "standard", and "shape (size)" in a record. Further, the library 30 stores attributes of "pin ID" for identifying each pin set to a component, "pin position" indicating a position of each pin on the component, and "noise generating level information" indicating a voltage level (noise generating level) where each pin generates noise in one and the same record. The database is structured by combining each component ID with pin IDs for respective pins, pin positions and noise generating level information with respect to each pin ID of the pins set to the component, and adding an identifier for identifying the combination to the component ID. By setting the identifier as a primary key, it can be identified that the component ID corresponds to the combinations of the pin IDs, pin positions and noise generating level information. Incidentally, all of the pins set to each component may be registered in the component library 30, and noise generating level information may be added to all of the registered pins. However, it is preferable to select a pin(s) having the possibility of generating noise to register the selected pins(s) in the component library 30, and add noise generating level information to all of the registered pin(s). Moreover, it is possible to prepare another library (database) for pins using the above-described information related to pins, etc., and by the use of the library, the variety of processing can be executed. In making the library, it is possible to specify the information on pins stored in the library 30 by, for example, setting a primary key.

The component locating means 35 used in this embodiment has the same configuration as that in the first embodiment. The functions and operation are also the same as those explained in the first embodiment.

The pin position detecting section 15 is used as a substitute for the component position detecting section 10 used in the first embodiment. The detecting section 15 identifies the position of the respective pins 21 to 26 (having the possibility of generating noise) set to an object component 20 on the printed circuit board 6.

The pin position voltage distribution detecting section 16 is used as a substitute for the component position voltage distribution detecting section 11 used in the first embodiment. The detecting section 16 detects and identifies each voltage level in the area where the respective pins 21 to 26 set to the component 20 are located on the printed circuit board 6.

The noise generating level comparing section 17 is used as a substitute for the noise generating level comparing section 12 used in the first embodiment. The comparing section 17 compares, with respect to each pin, a voltage level in the area where the respective pins 21 to 26 are located, which was detected by the pin position voltage distribution detecting section 16, with the noise generating level of the respective pins 21 to 26.

The error informing section 18 is used as a substitute for the error informing section 13 used in the first embodiment. As a result of the comparison by the noise generating level comparing section 17, when it is determined that the compared pin will generate noise, the error informing section 18 informs a user of the error. In this case, the informing section 18 may inform the user of the error with respect to each component as with the first embodiment, or with respect to each pin.

The component locating function section 14 is the same as that used in the first embodiment. The component locating function section 14 fixes (determines) a poison of the component 20 on the printed circuit board 6 on the basis of user's instructions, and stores the positional (location) information in a database, etc. (for example, the located component database 32, etc.).

Regarding the operation of each section included in the component locating means 35, when a plurality of pins are set to a component, each section can deal with a plurality of pins at a time (in parallel), or deal with each pin one by one.

In the following, an explanation will be given of operation according to the second embodiment referring to drawings. Incidentally in the following explanation, each database (including a library) is configured by a relational database.

Figure 17:
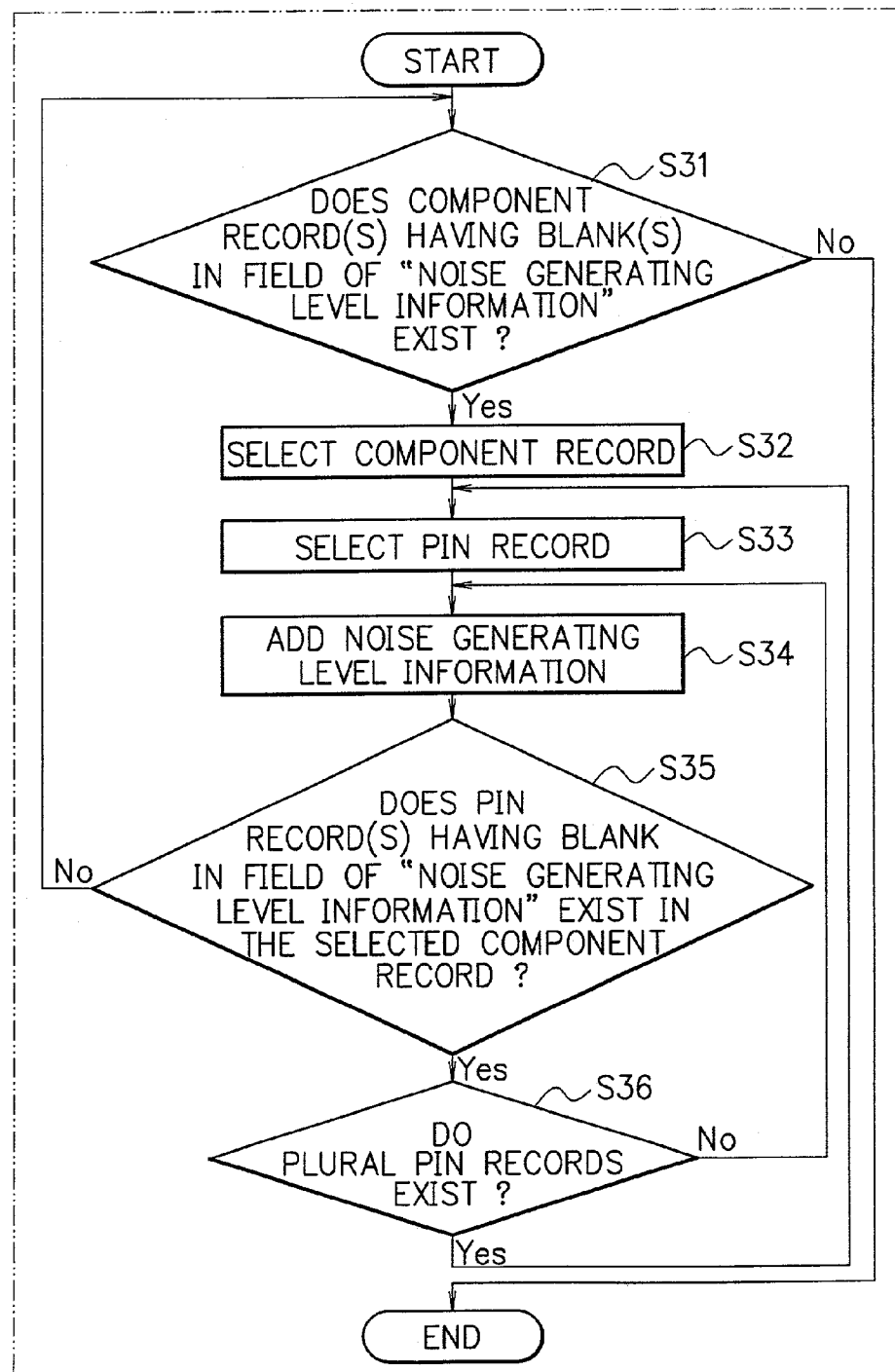
FIG. 17 is a flowchart showing a main operation of a noise generating level information adding means 34 used in the second embodiment.

First, an explanation will be given of operation of the noise generating level information adding means 34. The noise generating level information adding means 34 identifies (calculates) noise generating level with respect to each pin set to a component stored in the component library 30, and stores the identified noise generating level in a record corresponding to the respective pins. FIG. 17 is a flowchart showing this operation. The operation of the adding means 34 is triggered by the detection of an update of the component library 30. Incidentally, it is assumed that the respective pins registered in the component library 30 have the possibility of generating noise and the adding means 34 adds noise generating level information to all of the registered pins.

As shown in FIG. 17, firstly, the noise generating level information adding means 34 used in this embodiment determines whether or not there exists a record(s) having a blank(s) in the field of "noise generating level information" in the component library 30 shown in FIG. 16 (Step S31). In the library 30, each row with respect to each component ID (hereinafter referred to as a component record: the sections in the field of "component ID" for components A1, A2, . . . ,) are subdivided into a plurality of rows with respect to each pin set to the component (hereinafter referred to as a pin record; the sections in the field of "pin ID" for pins A1-1, pin A1-2, . . . , as shown in FIG. 16. The Step S31 in FIG. 17 is the same as the Step S11 in FIG. 5, and thereby, the same method executed in the Step S11 can be used in Step S31 to refer to each component record. Moreover, as a method of referring to each pin record, the adding means 34 can refer to each of the pin records in one component record one by one on a round-robin basis, for example.

When Yes in Step S31 as a result of the determination, the adding means 34 refers to the component record(s) having a blank(s) to select one component record having a blank(s) (Step S32). On the other hand, when No in Step S31 as a result of the determination, the adding means 34 finishes the processing.

Having selected one component record, the adding means 34 refers to a pin record(s) in the selected component record (for example, the component record of the component A1) to select one pin record having a blank in the field of "noise generating level information" by, for example, a round-robin method as described above (Step S33), and adds noise generating level information to the selected pin record (Step S34).

Subsequently, the adding means 34 determines whether or not there exists a pin record(s) having a blank in the field of "noise generating level information" in the selected component record (Step S35). When the result of the determination is Yes in Step S35, the adding means 34 determines whether or not there exist plural pin records each having a blank in the field of "noise generating level information" in the selected component record (Step S36). When plural pin records exist (Yes in Step S36), the adding means 36 goes back to Step S33. On the other hand, when only one record exists (No in Step S36), the adding means 34 goes back to Step S34. Moreover, when the result of the determination is No in Step S35, the adding means 34 goes back to Step S31.

Incidentally, as a substitute for the above-described processing in Steps S35 and S36, the adding means 34 can simply determines whether or not a pin record(s) exists. In this case, when Yes in Step S35, the adding means 34 goes back to Step S33.

Incidentally, it is possible to apply a method for calculating noise generating level on the basis of a value of current passing through an object pin, a method for setting in advance noise generating level information with respect to each pin (for example, on the basis of information provided form a manufacturer through a Web site, etc.), or the like. In any case, in this embodiment, it is preferable to configure a pin ID assigned to each pin so as to identify the role undertaken by each pin. For example, when 32 bits are set for a pin ID, the role of the pin (role ID) is assigned to the first or last 8 bits. By adding a role of each pin, it becomes possible to identify noise generating level information to be added to each pin by using each pin ID, role ID, and category on the basis of a primary key.

When calculating noise generating level on the basis of a value of current passing through an object pin, first, the field of "standard" in a component record including the pin record of the object pin is referred to identify a value of current passing through an object pin by, for example, using a primary key. Subsequently, a noise generating level is calculated on the basis of the current value, and the calculated noise generating level is stored in the field of "noise generating level information" of the object pin. Moreover, when setting in advance noise generating level with respect to each role undertaken by each pin, namely, when setting in advance an index (default value) of noise generating level with respect to each role of pins establishing a correspondence between each role of pins and the category of each pin, first, a noise generating level is identified by referring to a pin-by-pin level database 301 shown in FIG. 18 using the attribute "category" in a component record and the attribute "pin ID" in a pin record in the component library 30 shown in FIG. 16. Subsequently, the identified noise generating level is added to the field of "noise generating level information" of the object pin.

As shown in FIG. 18, the pin-by-pin level database 301 stores the attributes of "category" stored in a component record in the library 30, "role ID" assigned to a pin ID stored in a pin record in the library 30, and "noise generating level information" determined on the basis of the "category" and "role ID".

After a pin is selected, the noise generating level information adding means 34 refers the pin-by-pin level database 301 to identify the noise generating level on the basis of the category and the role ID indicating a role of the pin. Subsequently, the adding means 34 stores the identified noise generating level in the corresponding record in the library 30.

The above-described operation in the flowchart in FIG. 17 is executed each time a record of a newly registered component is stored in the component library 30. It is possible to start the series of processing shown in FIG. 17 by activating in advance an application for determining whether or not the component library 30 is updated at the time of starting the device 1 or during its performance so that the update of the component library 30 can be detected by the application and the processing can be started.

Figure 19:
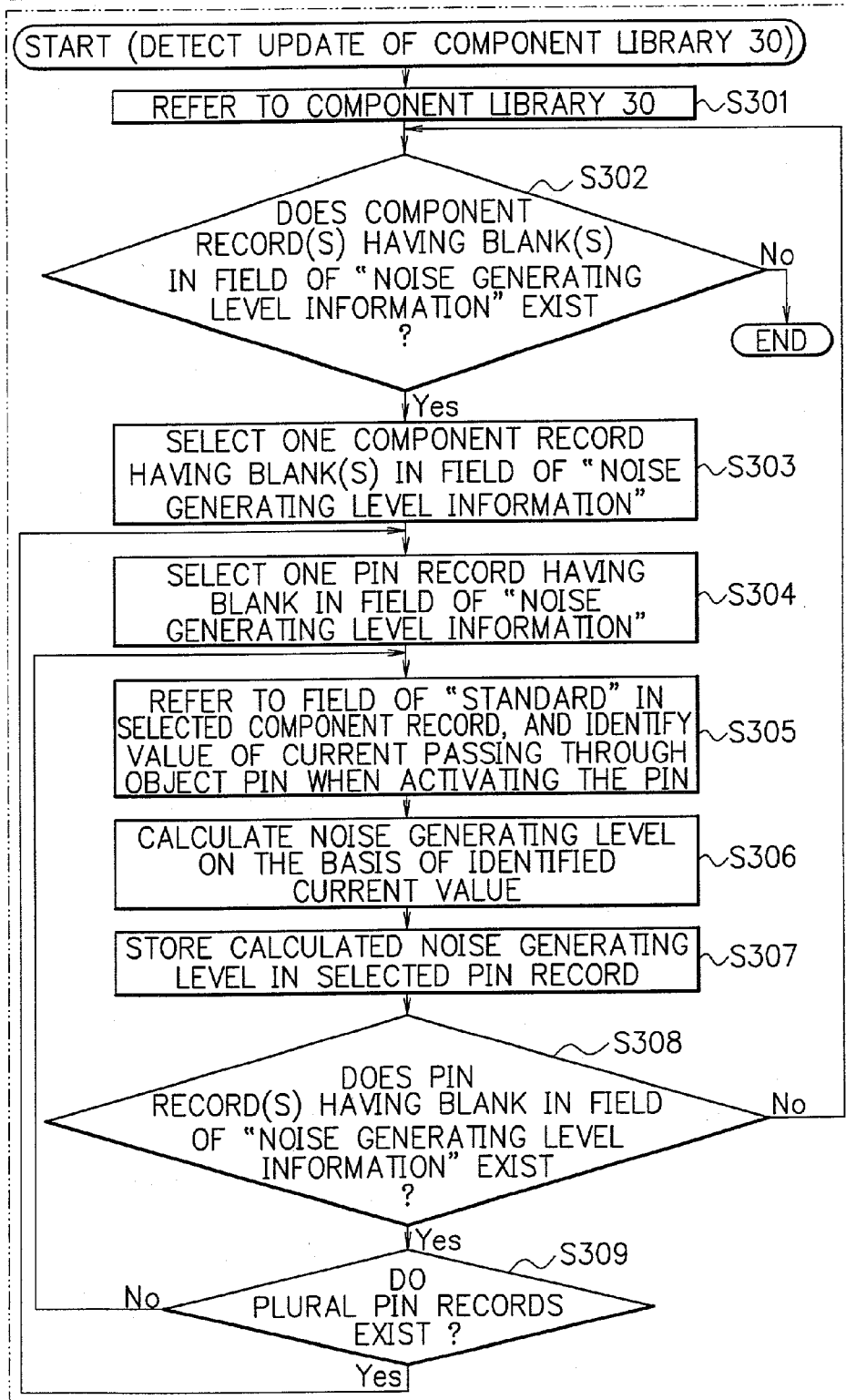
FIG. 19 is a flowchart showing operation of the noise generating level information adding means 34 when identifying a noise generating level on the basis of a value of current passing through each component, the current value being stored in a field of "standard" in the component library 30, used in the second embodiment.

Here is an explanation of operation of the noise generating level information adding means 34 when adding noise generating level information to the component library 30 on the basis of a current value referring to FIG. 19. As shown in FIG. 19, the processing in this flowchart is started triggered by the detection of the update of the component library 30.

First, the noise generating level information adding means 34 refers to component records in the component library 30 (Step S301). Subsequently, the adding means 34 determines whether or not there exists a component record(s) having a blank(s) in the field of "noise generating level information" (Step S302). As a result of the determination, when there exists such a component record(s) (Yes in Step S302), the adding means 34 selects one component record having a blank(s) (Step S303). In this processing, the adding means 34 selects one component record by, for example, a round-robin method as described above, or by another well-known method freely.

Subsequently, the adding means 34 selects, in the selected component record, one pin record having a blank in the field of "noise generating level information" by, for example, a round-robin method (Step S304). After that, the adding means 34 refers to the field of "standard" in the selected component record, and identifies the value of current passing through the object pin when the pin is activated (Step S305). Subsequently, the adding means 34 calculates the noise generating level on the basis of the identified current value (Step S306), and stores the calculated noise generating level in the field of "noise generating level information" of the selected pin record (Step S307).

Subsequently, the adding means 34 executes the processing in Steps S308 and S309, which is the same as that in Steps S35 and S36 in FIG. 17. Incidentally, when No in Step S308, the adding means 34 goes back to Step S302. Moreover, when Yes in Step S309, the adding means 34 goes back to Step S304. On the other hand, when No in Step S309, the adding means 34 goes back to Step S305.

Incidentally, as a substitute for the processing above-described in Steps S308 and S309, the adding means 34 can simply determines whether or not a pin record(s) exists in the same manner as described in connection with the explanation in FIG. 17. In this case, when Yes in Step S308, the adding means 34 goes back to Step S304. The method to select a pin record is not limited to the round robin method.

Here is an explanation of operation of the noise generating level information adding means 34 when adding noise generating level information to the component library 30 on the basis of a noise generating level set in advance with respect to each role undertaken by each pin.

Figure 20:
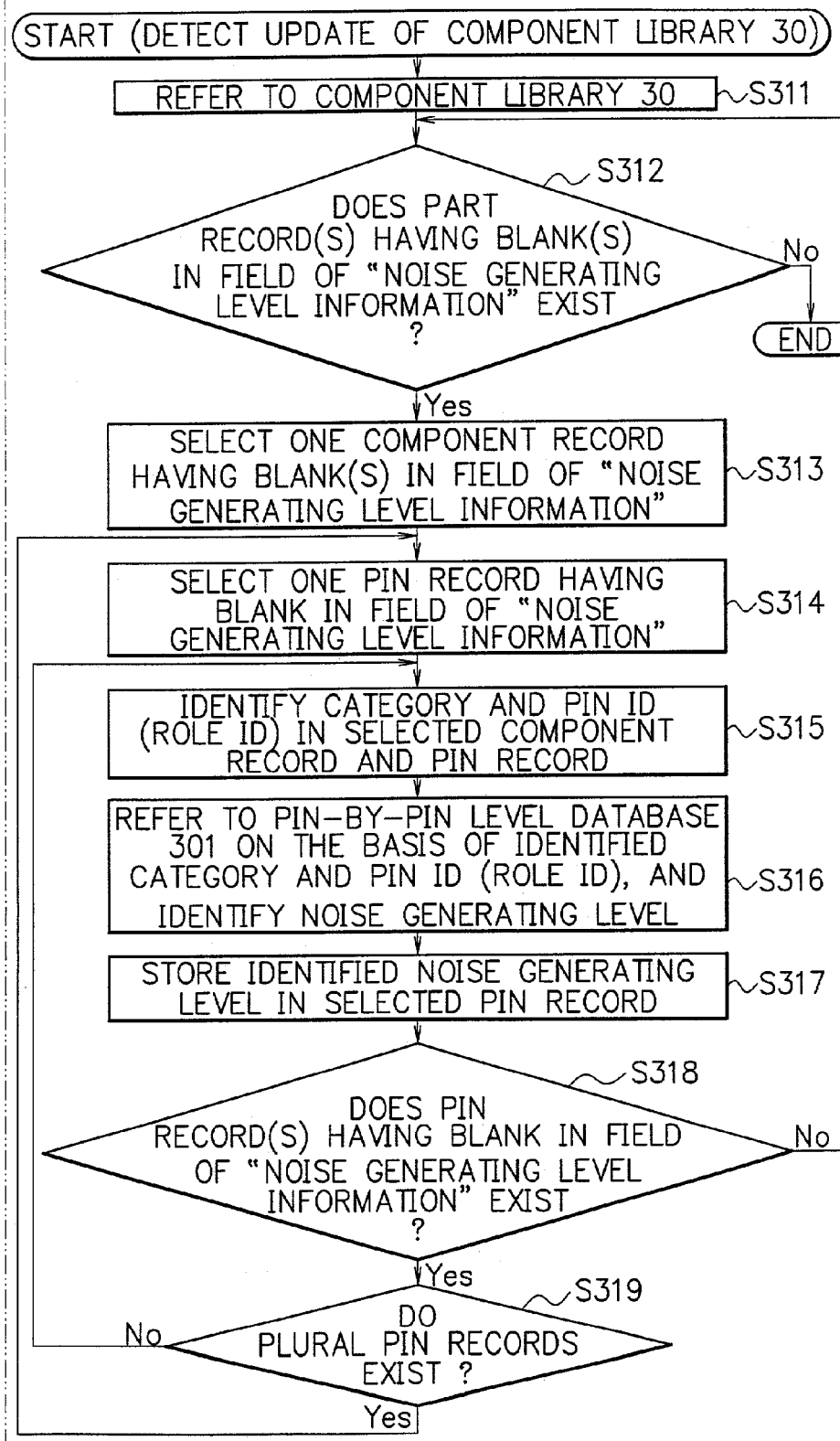
FIG. 20 is a flowchart showing operation of the noise generating level information adding means 34 when identifying a noise generating level using the pin-by-pin level database 301 used in the second embodiment.

As shown in FIG. 20, the processing in this flowchart is triggered by the detection of the component library 30 as with the flowchart in FIG. 19.

In this flowchart, the processing from Steps S311 to S314 is the same as that from Steps S301 to S304 in FIG. 19, and thereby, the explanation will be abbreviated.

After selecting one pin record having a blank in the field of "noise generating level information" in Step S314, the adding means 34 identifies the pin ID (role ID) in the selected pin record and the category to which the object pin belongs (Step S315).

Subsequently, the adding means 34 refers to the pin-by-pin level database 301 in FIG. 18 using the identified pin ID (role ID) and category as a key, and identifies the noise generating level of the selected pin (Step S316). Having identified the noise generating level, the adding means 34 stores the identified noise generating level in the field of "noise generating level information" of the selected pin record (Step S317).

Subsequently, the adding means 34 executes the processing in Steps S318 and S319, which is the same as that in Steps S35 and S36 in FIG. 17. Incidentally, when No in Step S318, the adding means 34 goes back to Step S312. Moreover, when Yes in Step S319, the adding means 34 goes back to Step S314. On the other hand, when No in Step S319, the adding means 34 goes back to Step S315.

Incidentally, as a substitute for the processing above-described in Steps S318 and S319, the adding means 34 can simply determine whether or not a pin record(s) exists in the same manner as with the explanation in FIG. 17. In this case, when Yes in Step S318, the adding means 34 goes back to Step S314. The method to select a pin record is not limited to the round robin method.

Incidentally, it is possible to register all of the pins set to components, or only the several pins each having the possibility of generating noise set to components in the component library 30. By the operation of the adding means as described above, noise generating level information is newly stored in any one of pin records.

In the following, an explanation will be given of operation of the component locating means 35 referring to the drawing.

Figure 21:
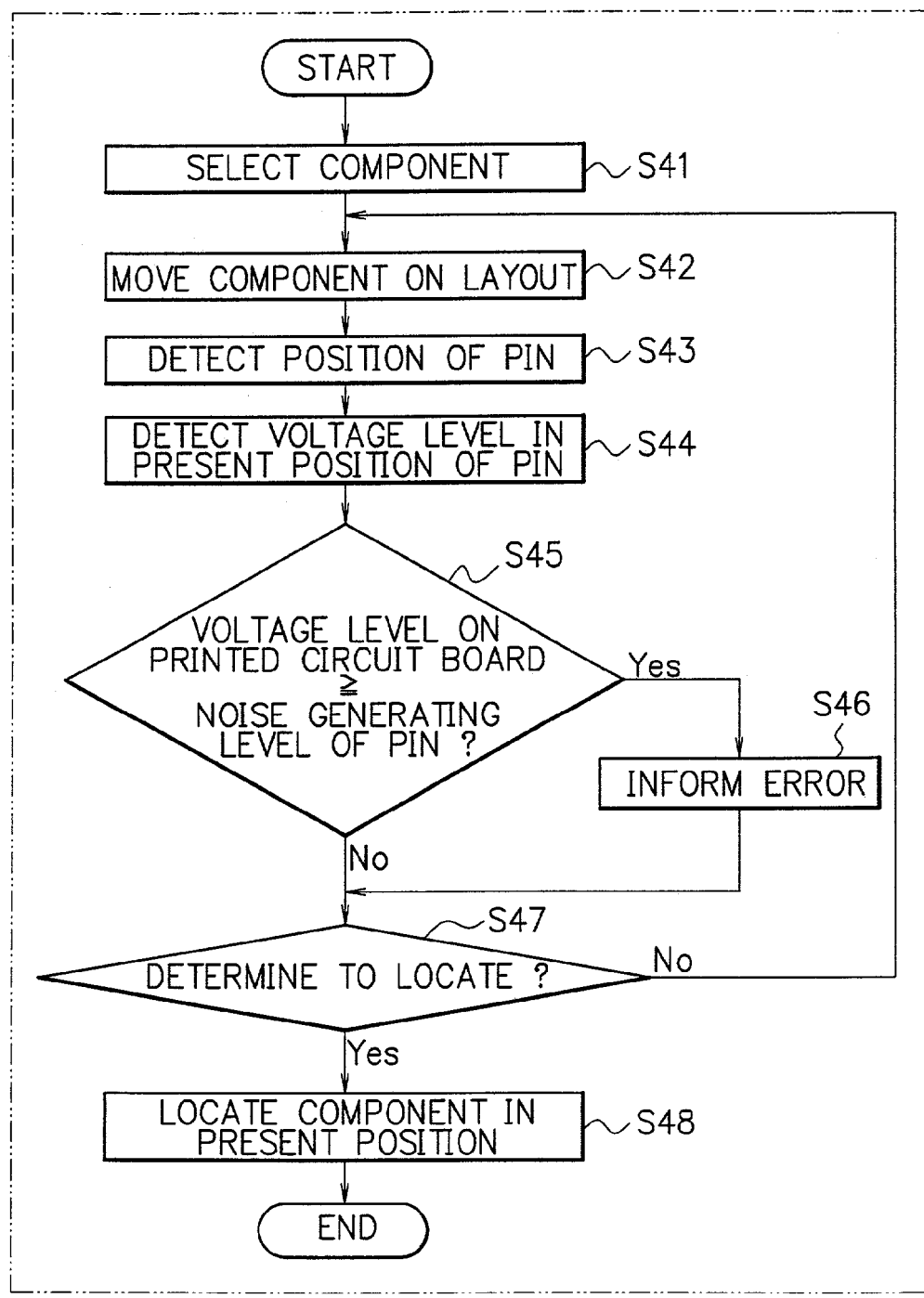
FIG. 21 is a flowchart showing operation of a component locating means 35 used in the second embodiment.

FIG. 21 is a flowchart showing operation of the component locating means 35 used in this embodiment. First, the component locating means 35 let a user select one component (hereinafter referred to as a component 20) to be located on the printed circuit board 6 from components stored in the component library 30 (Step S41). The user can selects a component as with the case of Step S21 in FIG. 9 in the first embodiment as described above. Incidentally, while in this example an explanation is given of a case of selecting one component, it is also possible to select a plurality of components. In this case, it is possible to execute the processing by a conversational style, etc., in which default values are automatically given to the records of the selected components and indicated to the user.

After the user selects the component 20 to be located or relocated, the component locating means 35 extracts the shape (size) of the selected component 20, the pin IDs of the pins set to the component 20 (each of the pins has the possibility of generating noise), and the position of the pins on the component 20 from the component library 30 using the component ID of the selected component 20 as a key. Subsequently, the locating means 35 reproduces the component 20 and pins set thereto, and displays them on the printed circuit board 6 shown in the displaying section 2 as shown in FIG. 13. Further, the locating means 35 moves the component 20 on the basis of the instructions issued from the user through the GUI as with the first embodiment (Step S42). Incidentally, the component 20 can be displayed in anywhere on the displaying section 2 as the starting position as with the first embodiment.

Further, the pin position detecting section 15 in the locating means 35 identifies the position of a pin (or plural pins or all pins) which may cause noise on the printed circuit board 6 (Step S43).

The detecting section 15 may start to detect the pin position triggered by the move of the component 20 by a predetermined distance in Step S42, or triggered by a predetermined-elapse timed by a timer, etc. (not shown). However, the way to start the detecting operation is not limited to the above description.

After the detecting section 15 detects the present position of the pin(s) on the printed circuit board 6 in Step S43, the pin position voltage distribution detecting section 16 in the locating means 35 detects a voltage distribution (voltage level) in the present position where the pin is located on the printed circuit board 6 (Step S44). The detecting section 16 can execute the detection processing only to the pin(s) having the possibility of generating noise among all of the pins set to the selected component 20.

After the detecting section 16 detects the voltage distribution(s) at the position of the pin(s) having the possibility of generating noise, the noise generating level comparing means 17 in the locating means 35 refers to the component library 30 on the basis of the component ID of the component 20 and the pin ID(s) of the object pin(s) to identify the noise generating level of the pin, and compares the identified noise generating level of the pin with the voltage level at the position of the pin detected in Step S44 to determine whether or not the compared pin generates noise (Step S45).

When the voltage level at the position is equal to or more than the noise generating level of the pin, in other words, the pin will generate noise (Yes in Step S45), the error informing section 18 in the locating means 35 informs the user of the error that the pin generates noise when the component 20 is located in the present position (Step S46), and moves to Step S47. The informing section 18 can inform the user about the error as with the same method described in the first embodiment. Moreover, in this embodiment, when informing the error, the informing section 18 may display the whole component 20 as error.

On the other hand, when the voltage level at the position is lower than the noise generating level of the pin, in other words, no pin will generate noise (No in Step S45), the locating means 35 moves to Step S47.

The component locating function section 14 in the component locating means 35 asks the user whether or not to locate the component 20 in the present position (Step S47). When the user determines to locate the component 20 in the present position (Yes in Step S47), the component locating function section 14 locates the component 20 on the printed circuit board 6 in the present position (Step S48), and finishes the series of operation. On the other hand, when the user determines not to locate the component 20 at the present position (No in Step S47), the component locating function section 14 in the locating means 35 goes back to the processing in Step S42 to move the component 20 on the basis of instructions from the user. Incidentally, the component locating means 35 can determine the position of the component 20 in Step 47 if at least one of the following conditions is satisfied, for example: the voltage level in the position where the pin is located on the printed circuit board 6 is lower than the noise generating level of the pin set to the component 20 in Step S45; the instructions for relocation are not inputted from the user through the GUI within a predetermined time; and after the component locating function section 14 asks the user whether or not to locate the component 20 in the present position through the displaying section 2, the user inputs the determination to locate the component 20.

In this way, by determining error with respect to each pin and informing the error to the user, the position where the component may generate noise can be avoided. Consequently, it is possible to design a layout of components on a printed circuit board wherein unnecessary noise will not be generated.

In the following, an explanation will be given of operation in detail of the second embodiment of the present invention referring to the drawings.

First, an explanation will be given of operation in detail when registering a new component in the component library 30.

When a user newly registers a component in the component library 30 in some way, the noise generating information adding means 34 is booted up. Subsequently, the adding means 34 refers to the attribute of "noise generating level information" in the pin records in the component library 30 to specify a pin record having a blank. Thereafter, the adding means 34 refers to the field of the "standard" in the component record to which the specified pin record belongs to identify the value of the current passing through the pin during the operation. After that, the adding means 34 calculates a noise generating level (voltage value) on the basis of the identified current value, and store it in the corresponding pin record as the noise generating level information. By this operation, the noise generating level information is added to each pin of a newly registered component. This operation is executed repeatedly until all of the records each having a blank in the field of "noise generating level information" is filled. Incidentally, while in the above description the adding operation is executed to one record at a time, the adding operation can be executed to all of the records each having a blank by inputting a zero (null) thereto automatically at a time.

Here an explanation will be given of operation of newly locating a component selected from the component library 30 on the printed circuit board.

As shown in FIG. 13, the printed circuit board 6 shown in FIG. 2 is displayed on the displaying section 2 in the device 1 used in this embodiment. On the printed circuit board, there are displayed voltage distributions 8 and 9 indicating voltage levels between a power source plane and a ground plane as shown in FIG. 13. In the following description, it is assumed that each of the pins 21 to 26 (refer to FIG. 14) has the possibility of generating noise. The pins 21 and 22 act as a noise source between the power source plane and the ground plane at the voltage level in the voltage distribution 8 or more, and the pins 23 to 26 act as a noise source therebetween at the voltage level in the voltage distribution 9 or more. Moreover, the voltage level in the area of the voltage distribution 8 is larger than that in the area of the voltage distribution 9.

Under such conditions, a user selects one component (hereinafter referred to as a component 20) to be located from the list compiled by records read out from the component library 30 using the component locating means 35. Incidentally, the same voltage value (level) as that in the voltage distribution 8 has been written in the field of the "noise generating level information" in the pin record of the respective pins 21 and 22, namely, the pins 21 and 22 generate noise when being located on the voltage distribution 8 on the printed circuit board 6. Further, the same voltage value (level) as that in the voltage distribution 9 has been written in the field of the "noise generating level information" in the pin record of the respective pins 23 to 26, namely, the pins 23 to 26 generate noise when being located on the voltage distribution 9. The center of the displaying section 2 is taken for the starting position of the component 20.

After the component 20 is displayed at the center of the displaying section 2, the user drags the component 20 using a mouse, etc. to move it to a desired position. The user can move the component also using arrow keys on a keyboard.

When the user moves the component 20 displayed at the center of the displaying section 2, the pin position detecting section 15 in the component locating means 35 detects each position of the pins 21 to 26 set to the component 20. The detecting process is started when the user moves the component 20 at a predetermined distance.

After the detecting means 15 detects the present position of the respective pins 21 to 26, the pin position voltage distribution detecting section 16 detects a voltage level in the area where each of the pins 21 to 26 is located on the printed circuit board 6. Subsequently, the noise generating level comparing section 17 in the locating means 35 identifies each noise generating level of the pins 21 to 26 by referring to the field of the "noise generating level information" in the component library 30. After that, the comparing section 17 compares the detected voltage level with the identified noise generating level of the respective pins 21 to 26. As shown in FIG. 13, the pins 22 and 23 are located in the area of the voltage distribution 9, and the respective pins 21 and 24 to 26 are located in a position where they have no possibility of generating noise. Thereby, the comparing section 17 compares the noise generating level of the respective pins 22 and 23 with the voltage level in the area of the voltage distribution 9 on the printed circuit board 6. As a result of the comparison, the pin 22 does not generate noise because the noise generating level added to the pin 22 is the same value as the voltage level in the voltage distribution 8 and the pin 22 is overlapped with the voltage distribution 9 on the printed circuit board 6. On the other hand, the pin 23 generates noise because the noise generating level added to the pin 23 is equal to the voltage value in the voltage distribution 9 and the pin 23 is overlapped with the voltage distribution 9.

Thereby, the error informing section 18 in the component locating means 35 informs the user of the error. As with the first embodiment, the informing section 18 can inform the user of the error by, for example, highlighting the component 20 or the pin 23 with a red color, etc.

Having been informed of the error, the user relocates the component 20 in the no-error position (it is also possible to locate a component in an error position according to need). Subsequently, the user inputs the determination to fix the component 20 in the position. The method for deciding the position of a component is the same as that in the first embodiment.

As described hereinbefore, in this embodiment, by executing the error determination with respect to each pin, it becomes possible to examine a locating position of main components such as LSI further in precisely. Consequently, unnecessary electromagnetic radiation can be suppressed.

Third Embodiment

While in the above-described first and the second embodiment the circuit design supporting device 1 has the standalone configuration, the circuit design supporting device (system) in this embodiment has a configuration such that a component library (which is the same as the component library 3 or 30 in the first or second embodiment, respectively) is shared via a network. In the following, the configuration and the operation will be explained taking some examples.

FIG. 22 is a diagram showing a configuration of the circuit design supporting system according to this embodiment. As shown in FIG. 22, circuit design supporting terminals 201*a*, 201*b*, 201*c*, . . . , each of which serves as the circuit design supporting device 1 in the first or second embodiment, are connected to a network 200. Each of the circuit design supporting terminals 201*a*, 201*b*, 201*c*, . . . , is an electronic apparatus capable of being connected to the Internet, for example, an electron computer such as a personal computer, PDA (personal digital assistance), a cellular phone, etc. Moreover, a computer (computing) function is installed to at least one of the terminals or the libraries (and/or a database(s)). Further, the terminals 201*a*, 201*b*, 201*c*, . . . , are provided with component libraries 300*a*, 300*b*, 300*c*, . . . , respectively. It is possible to use the component library 3 or 30 used in the first or second embodiment as the component libraries 300*a*, 300*b*, 300*c*, . . . , in this embodiment. Moreover, it is possible to install the component libraries 300*a*, 300*b*, 300*c*, . . . , in a single computer as a file server or a database and connect the computer to the respective terminals 201*a*, 201*b*, 201*c*, . . . , It is also possible to install the component library (300*a*, 300*b*, 300*c*, . . . ,) in a recording medium such as a hard disc set to the terminal (201*a*, 201*b*, 201*c*, . . . ,) as a file (or a database). The network 200 to which the terminals 201*a*, 201*b*, 201*c*, . . . , are connected may be LAN, WAN, etc.

Incidentally, data stored in the respective component libraries 300*a*, 300*b*, 300*c*, . . . , are shared via the network 200. It is preferable that each user who manages each terminals 201*a*, 201*b*, 201*c*, . . . , can arbitrarily set the sharing of the component libraries 300*a*, 300*b*, 300*c*, . . . , Thereby, it becomes possible to avoid disclosing data that a user hesitates to disclose (that should not be disclosed), and to share only data necessary to disclose.

By this configuration, the respective terminals 201a, 201b, 201c, . . . , can share the data stored in each other's library (300a, 300b, 300c, . . . ,) provided to the respective terminals 201a, 201b, 201c, . . . Moreover, data that should be disclosed is differentiated from data that should not be disclosed such as a company secret, and only the former data is shared. Thereby, it becomes possible to develop the circuit design far more efficiently. Particularly, in the case of using a relational database, when compiling a library, it becomes possible to avoid overlap of fields, etc. by the use of a primary key, and accordingly, it becomes possible to increase processing speed dramatically, and to take less time to update the library. Therefore, it becomes possible to prevent the system from being congested and to utilize system resources effectively. Further, it becomes possible to keep information not to disclose such as know-how in secret, and to differentiate data to disclose and data not to disclose.

In this embodiment, among the supporting devices 201a, 201b, 201c, . . . , it is also possible to share not only the component libraries 300a, 300b, 300c, . . . but also the databases, libraries, files, etc. described in the first or second embodiment.

Fourth Embodiment

The circuit design support system in the first and second embodiments can be configured as a distributed processing system wherein the operation and processing are distributed to a server and clients. In this embodiment, there is explained an example of the distributed processing system including a server and clients.

FIG. 23 is a diagram showing a configuration of a distributed processing system including a server and clients, which has the same functions as those in the first and second embodiments.

As shown in FIG. 23, the circuit design support system in this embodiment has the configuration such that a circuit design supporting server 210 is connected to circuit design supporting clients 211a, 211b, . . . , via a network 200. Moreover, a component library 300 is connected to the server 210. Incidentally, the component library 300 is the same as the library 3 or 30 in the first or second embodiment. In the following explanation, the device 1 in the first embodiment is applied to the fourth embodiment of the present invention. Obviously, the device 1 in the second embodiment can be also applied to this embodiment.

In the following, an explanation will be given of a configuration of the server 210, a client 211 (this client 211 is an arbitrary one among the clients 211a, 211b, . . . ), and the component library 300.

As shown in FIG. 24, the server 210 comprises a noise generating level information adding means 2104, a component locating means 2105, an I/O interface 2101, and a network interface 2102. The network interface 2102 is included for communicating with the client 211 via the network 200. The I/O interface 2101 is included for connecting to the component library 300. The I/O interface 2101 may be connected to the component library 300 via a network 200'. As described above, the component library 300 can be installed in a recording medium such as a hard disc in the server, or can be installed in another terminal. When the component library 300 is installed in another terminal, the I/O interface can be replaced by a network interface.

The noise generating level information adding means 2104 in the server 210 in FIG. 24 is of the same configuration and operates in the same manner as the adding means 4 in the first embodiment.

The component locating means 2105 in FIG. 24 includes a component position detecting section 2105.1, a component position voltage distribution detecting section 2105.2, a noise generating level comparing section 2105.3, an error informing section 2105.4, and a component locating function section 2105.5.

Under such configuration, the component position detecting section 2105.1 detects a position of the component 7 that was moved on the basis of instructions inputted from the client 211 via the network 200 on the printed circuit board 6.

The component position voltage distribution detecting section 2105.2 detects a voltage level on the printed circuit board 6 in the position of the component 7 detected by the detecting section 2105.1.

The noise generating level comparing section 2105.3 compares the voltage level detected by the detecting section 2105.2 with a nose generating level of the object component 7 stored in the component library 300 to determine whether or not the component 7 becomes a noise source.

The error informing section 2105.4 informs the client 211 (a user) that the component 7 will generate (create) noise via the network 200 when the comparing section 2105.3 determined that the component 7 would generate noise.

The component locating function section 2105.5, having received instructions to locate the component 7 in a present position from the client 211 via the network 200, locates the component 7 in the present position, and stores information including the positional (location) information in a database, etc. (when applying the first embodiment to this embodiment, the information is stored in the located component database 32).

The client 211 includes a displaying section 2111, an error informing section 2112, a network interface 2113, and a user interface 2114.

The displaying section 2111 in this embodiment may be the same as the displaying section 2 in the first embodiment.

The network interface 2113 is disposed for communicating with the server 210 via the network 200. The user interface 2114 serves as the inputting means 101. The user interface 2114 is used for inputting instructions from a user to move or locate the component 7, and for inputting information of a component to be registered in the component library 300, etc. The instructions and information, etc. inputted from the user interface 2114 is transmitted to the server 210 through the network interface 2113.

The error informing section 2112, having received the determination that the component 7 would generate noise from the server 210 through the network 200, informs the user of the error. The method for informing the user of the error is the same as that described in the first embodiment, and thereby, the explanation will be abbreviated.

In the following, an explanation will be given of operation of the circuit design support system in this embodiment.

First, an explanation will be given of operation of the noise generating level information adding means 2104 in this embodiment.

The noise generating level information adding means 2104 is triggered into operation each time the client 211 updates the component library 300. When a user (client 211) newly registers a component in the component library 300, the server is informed of at least one selected from the component ID, category, and type, in addition, shape, etc.

from the client 211. Moreover, when a component of data is changed and updated, etc., the server 210 is informed of the change, etc. from the client 211, and stores the information in the component library 300. The noise generating information adding means 2104 is triggered into action when the information is stored in the component library 300 (triggered by the update of the library 300).

When the component locating means 2105 is booted up in response to the request from the client 211, the server 210 requests the client 211 to determine which printed circuit board should be used for the design support processing, or to determine whether or not to use data having stored in the located component database 32 (which is the same as that used in any one of the first to third embodiments, for example).

After the client 211 determines (selects) an object printed circuit board 6, at least a component 7 (the client 211 may select one or more component and/or one or more category) and the like in response to the request, the server requires the client 211 to determine which component 7 should be located or relocated.

Having been informed that the component 7 (and the printed circuit board 6) is selected and subsequently moved by the client 211, the server 210 determines, using the component position detecting section 2105.1, the component position voltage distribution detecting section 2105.2 and the noise generating level comparing section 2105.3, whether or not the component 7 will generate noise in the present position on the basis of the move information as with the first embodiment. As a result of the determination, when it is determined that the component 7 will generate noise, the server 210 informs the client 211 of the result of the determination through the error informing section 2105.4. In response to the information, when the component 7 is moved by the client 211, the server 210 executes error determination again on the basis of conditions such as described in the first embodiment. On the other hand, when the server 210 received information to locate the component 7 in the present position from the client 211, the server 210 locates the component 7 in the present position, and stores the positional information in the located component database 32 or the like. In this way, the operation in this embodiment is the same as that explained in the first embodiment, namely, the operation in the first embodiment is applied to the distributed processing system used in this embodiment.

It is possible to apply various environments such as a distributed environment application model of two-layered structure and that of three-layered structure.

Fifth Embodiment

Next, an explanation will be given of a system for supporting designing a layout of components on a circuit board such as a printed circuit board according to a fifth embodiment of the present invention.

This embodiment has a configuration such that the component library 300 is connected to the network 200 as a file server. Under the configuration, each circuit board design support device 1 owned by each user downloads the contents of the library 300. Each user can modify and alter the contents of the library 300 for convenient use.

When applying the configuration, it is preferable to configure the system so as to reflect the changes on the user's side in the contents of the component library 300 serving as the file server. Thereby, it becomes possible to update the component library 300 at any time with the changes made by each user.

Sixth Embodiment

Next, an explanation will be given of a sixth embodiment of the present invention.

When a component generates (creates) noise, this becomes an obstacle in designing a layout of components on a printed circuit board, and in parallel, the component may generate heat. When components, especially integrated circuits such as LSI are used, the circuits generate heat in large quantity, and thereby, it is preferable to design a layout of the components such as LSI so as not to raise the temperature locally on (in) the printed circuit board.

In this embodiment, there is provided a device, a system, a server, a client, and a method for supporting designing a layout of components on a circuit board such as a printed circuit board, and a program for realizing the device so as to prevent the local rise of the heat on (in) a printed circuit board.

Figure 25A:
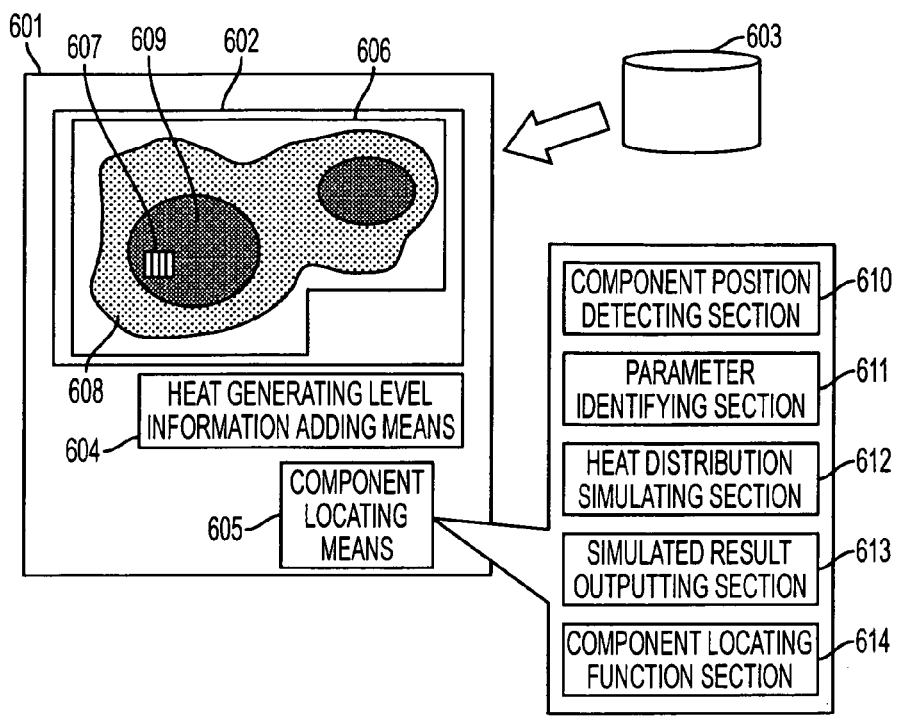
FIGS. 25A and 25B are block diagrams respectively showing a configuration of a circuit design supporting device according to a sixth embodiment of the present invention, FIG. 25A showing a case where a component is located on a printed circuit board, and FIG. 25B showing a case where a plurality of components (of the single or plural kinds) are located on a printed circuit board.
Figure 25B:
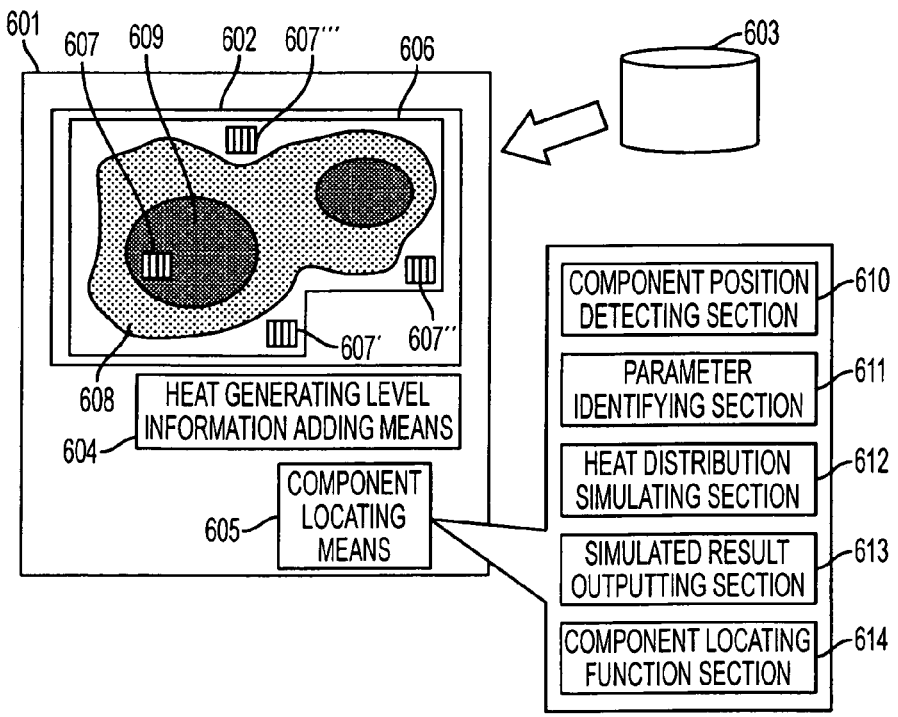

FIGS. 25A and 25B are diagrams respectively showing an example of the configuration of the supporting device according to this embodiment, FIG. 25A showing a case where a component is located on a printed circuit board, and FIG. 25B showing a case where a plurality of components (of the single or plural kinds) are located on a printed circuit board.

As shown in FIGS. 25A and 25B, the supporting device 601 in this embodiment comprises a displaying section 602, a component library 603, a heat generating level information adding means 604, and a component locating means 605.

In the displaying section 602, there is displayed a printed circuit board 606, a component 607, and heat distributions 608 and 609 on (in) the printed circuit board 606. The temperature indicated by the heat distribution 609 is higher than that indicated by the heat distribution 608.

The component locating means 605 used in this embodiment includes a component position detecting section 610, a parameter identifying section 611, a heat distribution simulating section 612, a simulated result outputting section 613, and a component locating function section 614.

In this configuration, the component library 603 has the same configuration as the component library 3 shown in the first embodiment except that the attribute of "noise generating level information" in the library 3 is replaced by the attribute of "heat generating level information". The heat generating level indicates the amount of generated heat per unit of time by voltage and current applied to a component. While it is possible to use, as a heat generating level, a value obtained from calculation by general rules, by way of experiment, or by way of experience, it is also possible to use, as a heat generating level, a value obtained from a value of current passing through a component and a value of voltage applied to the component. In this embodiment, the field of the "standard" in the component library 603 stores a value of voltage applied to activate each component and a value of current passing through each component by the applied voltage. It is possible to directly use the voltage value and the current value provided by manufacturers.

The heat generating level information adding means 604 used in this embodiment is started up (starts to fulfill its functions) triggered by the update of the component library 603 as with the first embodiment. After that, the adding means 604 identifies a heat generating level of the newly added component when the field of "heat generating level information" in its record is left blank, and stores the identified heat generating level in the field of "heat generating level information" therein.

The component locating means 605 supports a user for designing a layout of components using the component library 603.

The component position detecting section 610 set in the component locating means 605 detects a present position of the component 607 on the printed circuit board 606 as with the first embodiment.

The parameter identifying section 611 identifies all parameters for calculating a heat level in the area where the component 607 is located on the printed circuit board 606. The parameter includes the amount of heat that can be generated by the component 607 (which is calculated using the above-described current value and voltage value), heat conductivity, a heat emission speed factor(s) (including hydrodynamic factors such as Prandtl number, Reynolds number, etc.), specific heat, etc. The method for calculating the heat distribution is not limited, and thus it is possible to apply every method without deviating from the scope of the present invention. According to the applied method for calculating the heat distribution, the variety of the parameters identified by the parameter identifying section 611 is also changed.

The heat distribution simulating section 612 calculates (detects) the heat level at the position where the component 607 is located on the printed circuit board 606 using the parameters identified by the parameter identifying section 611.

The simulated result outputting section 613 outputs the simulated result calculated by the heat distribution simulating section 612 on the displaying section 602. It is possible to display an area having a relatively higher temperature on the printed circuit board 606 with a color having a relatively long wavelength such as a red color and an area having a relatively low temperature with a color having a relatively short wavelength such as a blue color.

The component locating function section 614 locates the component 607 at the present position on the basis of instructions from a user, and stores information including the positional information in a database (for example, in the located component database 32) as with the first embodiment.

By adopting such configuration in this embodiment, it becomes possible to locate the component 607 on the printed circuit board 606 while checking the simulated heat distribution in real time, and thus, it becomes possible to design a layout of components avoiding local heat generation at a high temperature.

While the explanation of this embodiment has been given by applying the first embodiment, it is also possible to apply the third, fourth and fifth embodiments to this embodiment.

Advantages of Present Invention

As set forth hereinbefore, a device, a system, a server, and a client for supporting designing a layout of components on a circuit board such as a printed circuit board, a method for supporting designing a layout of components on a circuit board and a program for realizing the device according to the present invention can be used for supporting designing a layout of components such as LSI on a circuit board, preferably, on a printed circuit board. The device configuration and the system configuration are as described above, and can be modified variously. Moreover, it is possible to locate any number of component(s) in one or more categories. The attributes of each component can be diversely changed by using a database including the library based on a relational database. Further, a noise generating level (and/or heat generating level) can be calculated by a well-known method, or calculated by using data about components provided by manufacturers, or extracted from a database, etc. The calculated or extracted noise generating level (and/or heat generating level) can be stored in the library, and utilized efficiently. By providing the library and database(s) with a key(s) (a primary key(s)), it is possible to search object items by (specifying the items) using the key, thus enabling effective implementation of the relational database without congestion. Thereby, it becomes possible to fulfill the functions of a relational database efficiently without congestion. Moreover, it is possible to use various displaying techniques freely, for example, by displaying a component that is in the process of location with a color different from others. Incidentally, when necessary data is not inputted in the library, namely, when there exists a blank(s) in a record(s) in the library, it is possible to ask a user the necessity of data input, and/or to add a default value(s) or a null (zero) to the blank automatically, etc. Further, when there exist a plurality of blanks, for example, it is also possible to fill the blanks one by one by selecting one blank by an arbitrary method or to fill all of the blanks at a time.

As set forth hereinbefore, according to the present invention, it becomes possible to design a layout of main components such as LSI, etc. wherein unnecessary electromagnetic radiation is suppressed.

This is realized by the configuration to help a user to locate a component at the position having no (or less) possibility of generating resonance (noise) between a power source plane and a ground plane in (on) a printed circuit board, the resonance being one of the reasons for generating unnecessary electromagnetic radiation.

Moreover in the configuration having the above-described advantage, the possibility of becoming a noise source is determined with respect to each pin. Thereby, it becomes possible to design a layout of main components such as LSI, etc. more finely and precisely.

Namely, error determination is executed with respect to each pin having the possibility of generating noise in a present position on the basis of a voltage value on a printed circuit board. Thereby, it becomes possible to determine the noise source with precision.

Further, by sharing the component library(s), etc. and implementing the present invention on the basis of a distributed processing system of a server-client type, it becomes possible to utilize resources effectively.

Furthermore, in accordance with the present invention, it is possible to prevent not only unnecessary electromagnetic radiation but also a local temperature rise on (in) a printed circuit board.

While the present invention has been described with reference to the particular illustrative embodiments, it is not to be restricted by the embodiment but only by the appended claims. It is to be appreciated that those skilled in the art can change or modify the embodiment without departing from the scope and spirit of the present invention.

What is claimed is:

1. A circuit design support device for designing a layout of electronic components on a circuit board to prevent the components from becoming a noise source or exceeding a predetermined temperature, the support device comprising:
   a noise generation level information adding means for adding noise generation level information a component library;
   a first component locating means which includes a component position detecting section for detecting a position of a component on the circuit board, a component position voltage distribution detecting section for detecting a voltage level at the position where the component is located, a noise generation level comparing section for comparing the voltage level detected by the component position voltage distribution detecting section with the noise generation level in the component library, and an error informing section for indicating an error when the voltage level detected is greater than or equal to the noise generation level in the component library;
a heat generation level information adding means for adding heat generation level information to the component library; and
a second component locating means which includes a component position detecting section for detecting a position of the component on the circuit board, a component position heat distribution detecting section for detecting a heat level at the position where the component is located, and a component locating section for locating the component on the circuit board based on the heat level,
wherein the design of the layout of the electronic components on the circuit board is based on at least one of voltage distribution information provided by the first component locating means or heat distribution information provided by the second component locating means.

2. The circuit design support device of claim 1, wherein the component position voltage distribution detecting section comprises a pin position detecting section for detecting a position of a pin of the component on the circuit board and a pin position voltage distribution detecting section for detecting a voltage level at the position where the pin is located, and
wherein the noise generation level comparing section compares the voltage level detected by the pin position voltage distributing section with the noise generation level of the pin in the library.

3. The circuit design support device claimed in claim 2, wherein the library includes at least component IDs for identifying the components and the heat generation level information of the components.

4. The circuit design support device claimed in claim 1, wherein the library includes at least component IDs for identifying the components and the heat generation level information of the components.

5. The circuit design support device claimed in claim 4, wherein the library is fed with at least one of the voltage level information and heat level information on the circuit board from the component position voltage distribution detecting section or the component position heat distribution detecting section and updated, the information being used for supporting the layout design of the components.

6. The circuit design support device claimed in claim 4, further comprising a displaying section for displaying at least one component and the voltage distribution or heat distribution on a display screen for reference in order to locate at least a component on the circuit board.

7. The circuit design support device claimed in claim 4, further comprising an interface for connecting the device to external devices or networks.

8. The circuit design support device claimed in claim 4, which is constructed as a stand-alone device.

9. The circuit design support device claimed in claim 4, further comprising a database having the library.

10. A circuit design support device for designing a layout of electronic components on a circuit board based on voltage distribution information on the circuit board, in a manner preventing the components from becoming a noise source, the support device comprising:
a noise generation level information adding means for adding noise generation level information to a component library; and
a component locating means which includes a component position detecting section for detecting a position of a component on the circuit board, a component position voltage distribution detecting section for detecting a voltage level at the position where the component is located, a noise generation level comparing section for comparing the voltage level detected by the component position voltage distribution detecting section with the noise generation level in the library, and an error informing section for indicating an error when the voltage level detected is greater than or equal to the noise generation level in the component library.

11. The circuit design support device claimed in claim 10, wherein the library includes at least component IDs for identifying the components and the noise generation level information of the components.

12. The circuit design support device claimed in claim 11, wherein the library is fed with the voltage level information on the circuit board from the component position voltage distribution detecting section and updated, the information being used for supporting the layout design of the components.

13. The circuit design support device claimed in claim 11, further comprising a displaying section for displaying at least one component and the voltage distribution on a display screen for reference in order to locate at least a component on the circuit board.

14. The circuit design support device claimed in claim 11, further comprising an interface for connecting the device to external devices or networks.

15. The circuit design support device claimed in claim 11, which is constructed as a stand-alone device.

16. The circuit design support device claimed in claim 11, further comprising a database having the library.

17. The circuit design support device claimed in claim 10, wherein the library is fed with the voltage level information on the circuit board from the component position voltage distribution detecting section and updated, the information being used for supporting the layout design of the components.

18. The circuit design support device claimed in claim 17, further comprising a displaying section for displaying at least one component and the voltage distribution on a display screen for reference in order to locate at least a component on the circuit board.

19. The circuit design support device claimed in claim 17, further comprising an interface for connecting the device to external devices or networks.

20. The circuit design support device claimed in claim 17, which is constructed as a stand-alone device.

21. The circuit design support device claimed in claim 17, further comprising a database having the library.

22. The circuit design support device claimed in claim 10, further comprising a displaying section for displaying at least one component and the voltage distribution on a display screen for reference in order to locate at least a component on the circuit board.

23. The circuit design support device claimed in claim 22, further comprising an interface for connecting the device to external devices or networks.

24. The circuit design support device claimed in claim 22, which is constructed as a stand-alone device.

25. The circuit design support device claimed in claim 22, further comprising a database having the library.

26. The circuit design support device claimed in claim 10, further comprising an interface for connecting the device to external devices or networks.

27. The circuit design support device claimed in claim 26, which is constructed as a stand-alone device.

28. The circuit design support device claimed in claim 26, further comprising a database having the library.

29. The circuit design support device claimed in claim 10, which is constructed as a stand-alone device.

30. The circuit design support device claimed in claim 29, further comprising a database having the library.

31. The circuit design support device claimed in claim 10, further comprising a database having the library.

32. The circuit design support device as claimed in claim 10, wherein the component position voltage distribution detecting section comprises a pin position detecting section for detecting a position of a pin of the component on the circuit board and a pin position voltage distributing detecting section for detecting a voltage level at the position where the pin is located, and
  wherein said noise generation level comparing section compares the voltage level detected by the pin position voltage distribution detecting section with the noise generation level of the pin in the library.

33. The circuit design support device claimed in claim 32, wherein the library includes at least component IDs for identifying the components and the noise generation level information of the components.

34. A circuit design support system for designing the layout of electronic components on a circuit board, comprising the device claimed in any of claims 11 3 17 27 or 10–32 and a database having the library.

35. The circuit design support system claimed in claim 34, wherein the library includes at least component IDs for identifying the components and the noise generation level information.

36. The circuit design support system claimed in claim 35, wherein the library is fed with the voltage level information on the circuit board from the component position voltage distribution detecting section and updated, the information being used for supporting the layout design of the components.

37. The circuit design support system claimed in claim 35, which is constructed as a stand-alone system.

38. The circuit design support system claimed in claim 34, wherein the library is fed with the voltage level information on the circuit board from the component position voltage distribution detecting section and updated, the information being used for supporting the layout design of the components.

39. The circuit design support system claimed in claim 38, which is constructed as a stand-alone system.

40. The circuit design support system claimed in claim 34, which is constructed as a stand-alone system.

41. The circuit design support device claimed in claim 32, wherein the library is fed with the voltage level information on the circuit board from the component position voltage distribution detecting section and updated, the information being used for supporting the layout design of the components.

42. The circuit design support device claimed in claim 32, further comprising a displaying section for displaying at least one component and the voltage distribution on a display screen for reference in order to locate at least a component on the circuit board.

43. The circuit design support device claimed in claim 32, further comprising an interface for connecting the device to external devices or networks.

44. The circuit design support device claimed in claim 32, which is constructed as a stand-alone device.

45. The circuit design support device claimed in claim 32, further comprising a database having the library.

* * * * *

UNITED STATES PATENT AND TRADEMARK OFFICE
CERTIFICATE OF CORRECTION

PATENT NO. : 7,114,132 B2  Page 1 of 1
APPLICATION NO. : 10/125350
DATED : September 26, 2006
INVENTOR(S) : Yaguchi It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (470) days Delete the phrase "by 470" and insert -- by 567 --.

Signed and Sealed this

Eighth Day of January, 2008

JON W. DUDAS
*Director of the United States Patent and Trademark Office*